US012607694B2

(12) United States Patent　　(10) Patent No.:　US 12,607,694 B2
Guo　　(45) Date of Patent:　Apr. 21, 2026

(54) SUPPRESSION OF BACKGROUND TISSUE SIGNALS IN VELOCITY SELECTIVE ARTERIAL SPIN LABELING (VSASL)

(71) Applicant: The Regents of the University of California, Oakland, CA (US)

(72) Inventor: Jia Guo, Yorba Linda, CA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 18/807,739

(22) Filed: Aug. 16, 2024

(65) Prior Publication Data

US 2025/0060441 A1　　Feb. 20, 2025

Related U.S. Application Data

(60) Provisional application No. 63/520,328, filed on Aug. 17, 2023.

(51) Int. Cl.
　G01R 33/54　　(2006.01)
(52) U.S. Cl.
　CPC ................................. G01R 33/543 (2013.01)
(58) Field of Classification Search
　CPC ........................ G01R 33/543; G01R 33/56366
　See application file for complete search history.

(56) References Cited

U.S. PATENT DOCUMENTS

| | | |
|---|---|---|
| 2,473,318 A | 6/1949 | Donald |
| 4,988,947 A | 1/1991 | Ugurbil et al. |

| | | | |
|---|---|---|---|
| 7,545,141 B2 | 6/2009 | Kimura | |
| 7,587,233 B2 | 9/2009 | Wong et al. | |
| 8,212,560 B2 | 7/2012 | Moeller et al. | |
| 9,911,206 B2 * | 3/2018 | Li | ........................... G06T 11/003 |
| 12,282,080 B1 * | 4/2025 | Guo | .................. G01R 33/5608 |
| 2005/0277825 A1 | 12/2005 | Wong et al. | |

(Continued)

FOREIGN PATENT DOCUMENTS

| | | |
|---|---|---|
| CN | 109752683 A | 5/2019 |
| CN | 110197106 A | 9/2019 |

(Continued)

OTHER PUBLICATIONS

International Search Report and Written Opinion mailed Jun. 16, 2022 for International Patent Application No. PCT/US2022/023126, pp. 1-17.

(Continued)

*Primary Examiner* — Baisakhi Roy
(74) *Attorney, Agent, or Firm* — Perkins Coie

(57)　　ABSTRACT

A method of operating a magnetic resonance imaging (MRI) system includes configuring the system to receive an input indicative of time intervals to be used for imaging a target object; controlling the one or more RF coils to apply a first order of modules including at least a first control module at a first time point and a first labeling module at a second time point to a target object, controlling the one or more RF coils to operate a second order of modules including at least a second labeling module at a third time point and a second control module at a fourth time point to the target object, wherein all the four modules invert the magnetization of the target object to suppress the MRI signal.

20 Claims, 18 Drawing Sheets

(56) References Cited

U.S. PATENT DOCUMENTS

| | | | |
|---|---|---|---|
| 2008/0281186 A1 | 11/2008 | Kuhara | |
| 2010/0030062 A1 | 2/2010 | Bolar et al. | |
| 2010/0191099 A1* | 7/2010 | Salerno | G01R 33/5601 |
| | | | 600/420 |
| 2012/0268126 A1 | 10/2012 | Guo et al. | |
| 2012/0283547 A1 | 11/2012 | Wong et al. | |
| 2015/0309134 A1 | 10/2015 | Meakin et al. | |
| 2015/0323630 A1* | 11/2015 | Weingartner | G01R 33/50 |
| | | | 324/309 |
| 2017/0160365 A1* | 6/2017 | Helle | G01R 33/56366 |
| 2017/0176564 A1 | 6/2017 | Qin et al. | |
| 2017/0293008 A1 | 10/2017 | Qin | |
| 2019/0128988 A1 | 5/2019 | Von Samson-Himmelstjerna | |
| 2019/0310337 A1* | 10/2019 | Carinci | G01R 33/543 |
| 2020/0284864 A1* | 9/2020 | Damen | G01R 33/56563 |
| 2022/0304582 A1* | 9/2022 | Chang | A61B 5/0263 |
| 2023/0329576 A1* | 10/2023 | Bonanno | G01R 33/5602 |
| 2025/0004083 A1 | 1/2025 | Guo | |
| 2025/0116739 A1 | 4/2025 | Guo et al. | |

FOREIGN PATENT DOCUMENTS

| | | |
|---|---|---|
| WO | 2015158879 A1 | 10/2015 |
| WO | 2022221076 A1 | 10/2022 |
| WO | 2023150468 A1 | 8/2023 |

OTHER PUBLICATIONS

International Search Report and Written Opinion mailed Jun. 21, 2023 for International Patent Application No. PCT/US23/61384, pp. 1-16.

Guo, Jia, et al., "An optimized design to reduce eddy current sensitivity in velocity-selective arterial spin labeling using symmetric BIR-8 pulses", Magnetic Resonance in Medicine, 73(3)., 2015, 1085-1094.

Guo, Jia , et al., "Comparison of velocity-selective arterial spin labeling schemes", Magnetic Resonance in Medicine; 85(4)., 2021, 2027-2039.

Guo, Jia, et al., "Increased SNR Efficiency in Velocity Selective Arterial Spin Labeling Using Multiple Velocity Selective Saturation Modules (mm-VSASL)", Magnetic Resonance in Medicine; 74., 2015, 694-705.

Guo, Jia , "Robust dual-module velocity-selective arterial spin labeling (dm-VSASL) with velocity-selective saturation and inversion", Magnetic Resonance in Medicine; 89(3)., 2023, 1026-1040.

Qin, Qin , et al., "Velocity-Selective-Inversion Prepared Arterial Spin Labeling", Magnetic Resonance in Medicine; 76., 2016, 1136-1148.

Wong, Erin C., et al., "Velocity-selective arterial spin labeling", Magnetic Resonance in Medicine; 55(6)., 2006, 1334-41.

Ye, Frank Q., et al., "Noise reduction in 3D perfusion imaging by attenuating the static signal in arterial spin tagging (ASSIST)", Magnetic Resonance in Medicine; 44(1)., 2000, 92-100.

Buxton et al. "A General Kinetic Model for Quantitative Perfusion Imaging with Arterial Spin Labeling," Magnetic Resonance in Medicine, Sep. 1998, 40(3):383-396.

Liu et al. "A mathematical model for velocity-selective arterial spin labeling," Magnetic Resonance in Medicine, Apr. 2024, 91(4):1384-1403.

Woods et al. "Recommendations for quantitative cerebral perfusion MRI using multi-timepoint arterial spin labeling: Acquisition, quantification, and clinical applications," Magnetic Resonance in Medicine, Aug. 2024, 92(2):469-495.

Guo, Jia, "Dual-module velocity-selective arterial spin labeling (dm-VSASL) using velocity-selective saturation and inversion pulses," Proceedings of the Joint Annual Meeting ISMRM-ESMRMB 2022 & ISMRT Annual Meeting, London, UK, May 7-12, 2022, Apr. 22, 2022, 335, 4 pages.

Extended European Search Report from European Patent Application No. 23750316.4 dated Dec. 23, 2025, 9 pages.

* cited by examiner

ASL signal (a.u.)

Complex-recon is needed to avoid
rectification errors (arrows, PCASL)

Background suppression level

Background suppression level

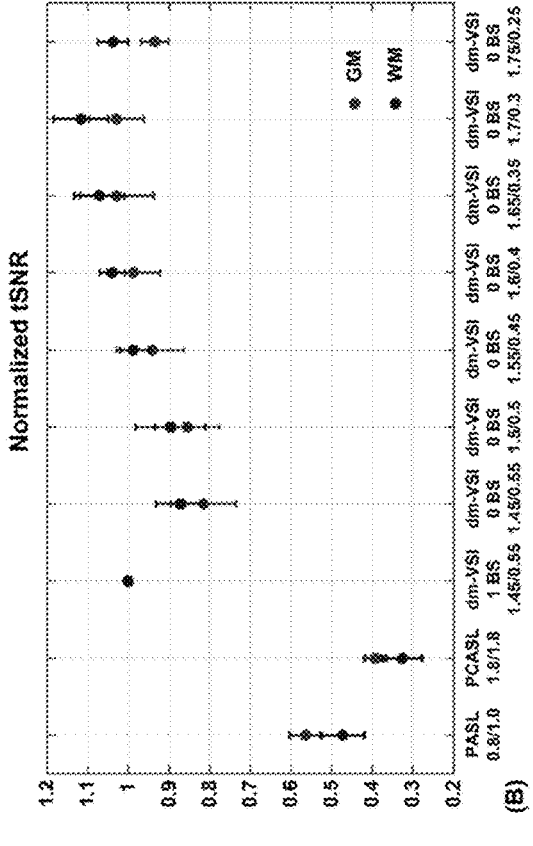
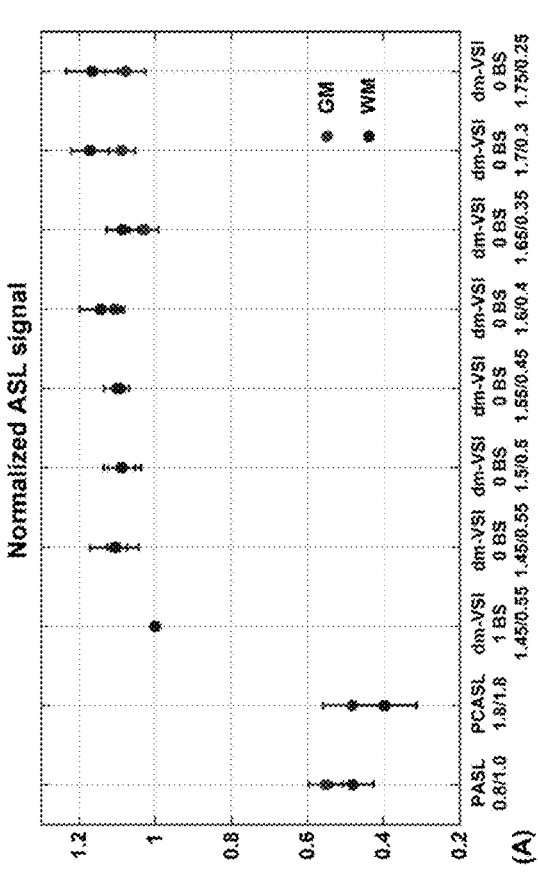
FIG. 10

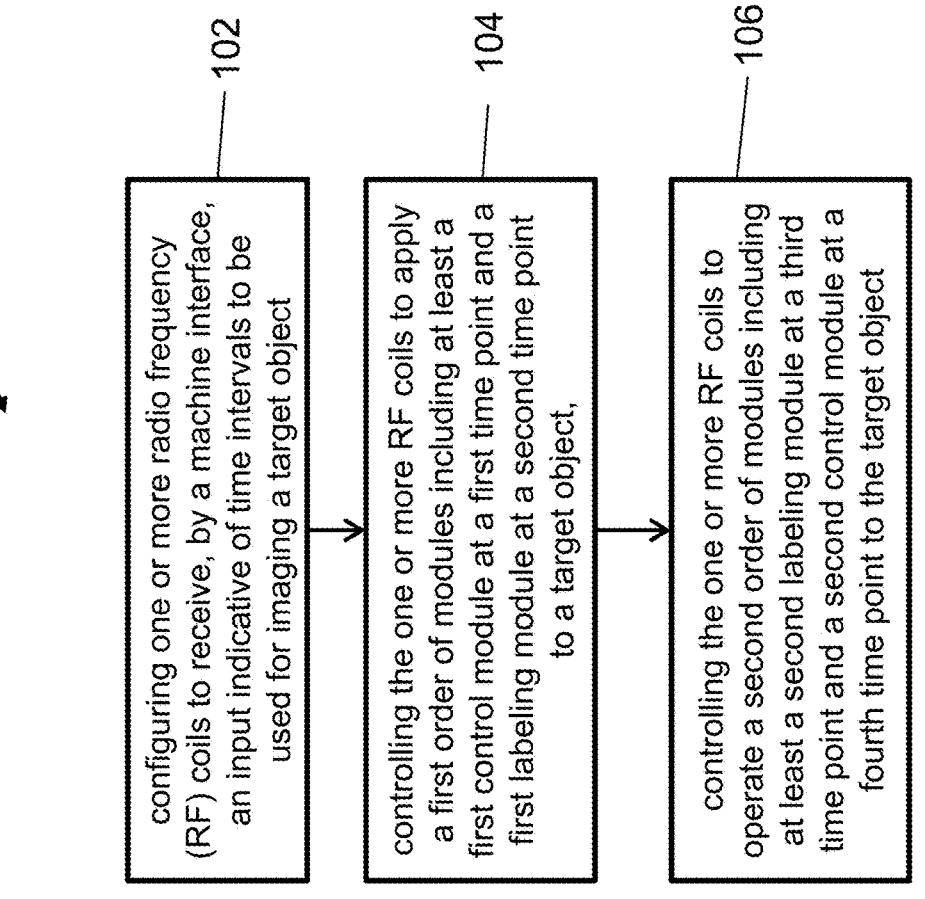

100 configuring one or more radio frequency (RF) coils to receive, by a machine interface, an input indicative of time intervals to be used for imaging a target object

102 controlling the one or more RF coils to apply a first order of modules including at least a first control module at a first time point and a first labeling module at a second time point to a target object,

104 controlling the one or more RF coils to operate a second order of modules including at least a second labeling module at a third time point and a second control module at a fourth time point to the target object

802 Applying a first order of modules

804 Applying a second order of modules 806 generating an MRI image

SUPPRESSION OF BACKGROUND TISSUE SIGNALS IN VELOCITY SELECTIVE ARTERIAL SPIN LABELING (VSASL)

CROSS-REFERENCE TO RELATED APPLICATION

This patent document claims the benefit of priority of U.S. Provisional patent application 63/520,328, dated Aug. 17, 2023, entitled "SUPPRESSION OF BACKGROUND TISSUE SIGNALS IN VELOCITY SELECTIVE ARTERIAL SPIN LABELING (VSASL)," which is incorporated by reference in its entirety in the present document.

STATEMENT REGARDING FEDERALLY SPONSORED RESEARCH

This invention was made with government support under Grant No. R01EB033210 awarded by NIH. The government has certain rights in the invention.

TECHNICAL FIELD

This patent document relates to systems, devices, and processes for magnetic resonance imaging.

BACKGROUND

Imaging through Magnetic Resonance Imaging (MRI) techniques has been widely applied in imaging applications in medical, biological and other fields. A typical MRI technique produces an image of a selected body part of an object under examination by manipulating the magnetic spins in a body part and processing measured responses from the magnetic spins. An MRI system may include hardware to generate different magnetic fields for imaging, including a static magnetic field along a Z-direction to polarize the magnetic spins, gradient fields along mutually orthogonal x, y, or Z directions to spatially select a body part for imaging, and a radio frequency (RF) magnetic field to manipulate the spins.

SUMMARY

Techniques, systems and apparatus are described for a magnetic resonance imaging (MRI) system for suppressing background tissue signals in a velocity-selective arterial spin labeling (VSASL) application, for example, without using additional background suppression pulses.

In one example aspect, a disclosed method includes configuring the system to receive, by a machine interface, an input indicative of time intervals to be used for imaging a target object; controlling the one or more RF coils to apply a first order of modules including at least a first control module at a first time point and a first labeling module at a second time point to a target object, wherein both the first and the second modules invert a magnetization of the target object; controlling the one or more RF coils to operate a second order of modules including at least a second labeling module at a third time point and a second control module at a fourth time point to the target object, wherein both the third and the fourth modules invert the magnetization of the target object, wherein the time intervals correspond to time differences between the first time point and the second time point, between the third and the fourth time point, between the second time point and an image acquisition time, and between the fourth time point and the image acquisition.

In another example aspect, an MRI system includes: a magnet; one or more radio frequency (RF) coils; one or more processors; and a machine interface; wherein the one or more processors are configured to generate an MRI image by: receiving, on the machine interface, an input indicative of time intervals to be used for imaging a target object; controlling the one or more RF coils to apply a first order of modules including at least a first control module at a first time point and a first labeling module at a second time point to a target object, wherein both the first and the second modules invert a magnetization of the target object; controlling the one or more RF coils to operate a second order of modules including at least a second labeling module at a third time point and a second control module at a fourth time point to the target object, wherein both the third and the fourth modules invert the magnetization of the target object, wherein the time intervals correspond to time differences between the first time point and the second time point, between the third and the fourth time point, between the second time point and an image acquisition, and between the fourth time point and the image acquisition.

In yet another aspect, a computer readable medium having processor-executable code is disclosed. The code, upon execution by one or more processors, causes the one or more processors to implement a method of obtaining a magnetic resonance imaging (MRI) image of a target using an MRI system including: receiving, from a machine interface, an input indicative of time intervals to be used for imaging a target object; controlling one or more RF coils to apply a first order of modules including at least a first control module at a first time point and a first labeling module at a second time point to a target object, wherein both the first and the second modules invert a magnetization of the target object; controlling the one or more RF coils to operate a second order of modules including at least a second labeling module at a third time point and a second control module at a fourth time point to the target object, wherein both the third and the fourth modules invert the magnetization of the target object, wherein the time intervals correspond to time differences between the first time point and the second time point, between the third and the fourth time point, between the second time point and an image acquisition, and between the fourth time point and the image acquisition.

These and other aspects and associated implementations and benefits of the disclosed technology are described in greater detail in the drawings, the description and the claims.

BRIEF DESCRIPTION OF THE DRAWINGS

FIG. 10 are graphs showing example results obtained in various ASL methods and BS schemes.

FIG. 11 is a flowchart of an example method of operating an MRI system.

DETAILED DESCRIPTION

Figure 1:
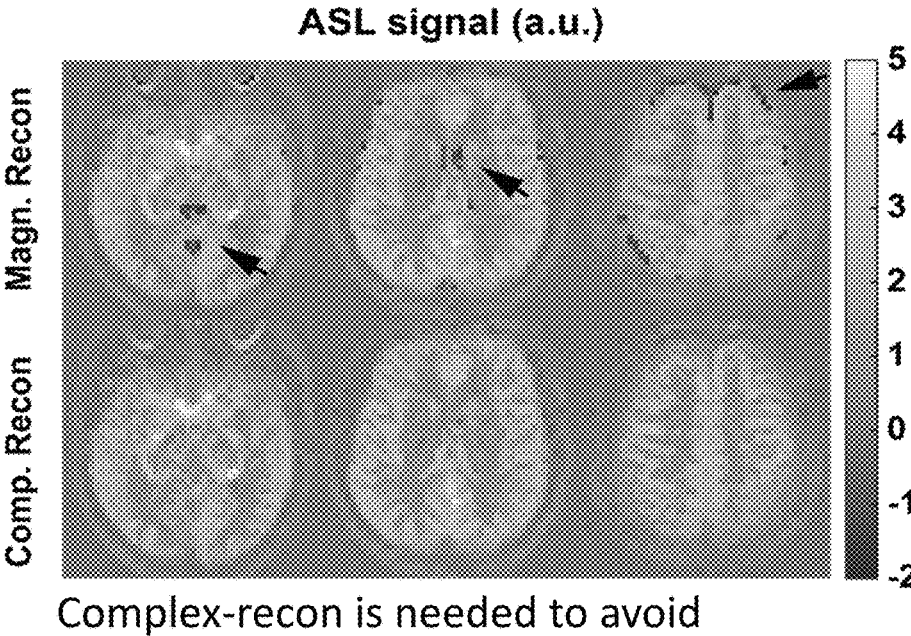
FIG. 1 shows an example MRI image showing rectification errors.

In recent years, advances in magnetic resonance imaging (MRI) technology have led to emergence of MRI imaging systems that provide better image clarity for medical diagnostic purpose than previous MRI systems. However, certain medical applications still present a challenge to present day MRI systems.

Perfusion imaging using arterial spin labeling (ASL) is an important technique used in diagnostics and research. Current velocity selective ASL (VSASL) uses either single or multiple VS Saturation (VSS), or single VS Inversion (VSI) for arterial labeling. These methods have sub-optimal SNR performance. More importantly, the VSASL signal is not as stable as other ASL methods, and the temporal signal-to-noise ratio (tSNR) is typically unsatisfactory in practice due to noise and artefacts from sources such as motion, eddy current and diffusion attenuation effects.

Although ASL MRI is a powerful and completely non-invasive perfusion imaging method in research and clinical settings, due to its low intrinsic signal-to-noise ratio (SNR), background suppression (BS) is typically required (or strongly recommended) in all ASL scans to reduce the noise from tissues (e.g., gray and white matters in the brain) that do not contribute to the perfusion signal. BS is typically implemented as a few additional RF pulses to invert and suppress the magnetization of tissues when MR images are acquired. On the other hand, each additional BS pulse reduces the ASL signal by about 5% as the BS pulses are not perfect, and deposits additional RF energy (specific absorption rate, or SAR) to the patient/subject. The latter is more of a concern at ultra-high fields, such as 7.4 T, due to safety, and sometimes may limit its successful implementation in practice.

VSASL holds great promise in imaging perfusion accurately as it is not sensitive to transit delay effects that conventional ASL methods suffer from. Recently, the inventor disclosed, in International patent application PCT/US2023/061384, entitled "MULTI-MODULE VELOCITY SELECTIVE LABELING WITH IMPROVED STABIL- ITY AND ACCURACY IN IMAGING APPLICATIONS," a technique that overcomes the above-discussed technical challenges in VSASL, among others. The method disclosed in the aforementioned International patent application significantly improves the robustness and temporal signal-to-noise ratio (SNR) of VSASL. Currently, the BS methods in VSASL, including dual-module VSASL (dm-VSASL), use additional BS pulses to suppress tissue signals, and have the short-comings as mentioned above. Good BS strategies are desired in dm-VSASL, especially those capable of suppressing all brain tissues including cerebrospinal fluid (CSF), which contribute significant amount of noise in VSASL signals. In addition, when implemented at ultra-high fields, BS methods that have reduced SAR are strongly preferred.

1. BRIEF OVERVIEW OF DM-VSASL DISCLOSED IN PCT/US2023/061384

Recently, the inventor disclosed MRI techniques in International Patent Application PCT/US2023/061384, incorporated herein by reference in its entirety. This technique overcomes several practical disadvantages associated with conventional techniques as briefly discussed next.

Perfusion imaging using arterial spin labeling (ASL) is an important technique used in diagnostics and research. Current velocity selective ASL (VSASL) uses either single or multiple VS Saturation (VSS), or single VS Inversion (VSI) for arterial labeling. These methods have sub-optimal SNR performance. More importantly, the VSASL signal is not as stable as other ASL methods, and the temporal signal-to-noise ratio (tSNR) is typically unsatisfactory in practice due to noise and artefacts from sources such as motion, eddy current and diffusion attenuation effects.

The techniques described in PCT/US2023/061384 may be used to overcome these limitations of the present day ASL techniques, among others.

Figure 14:
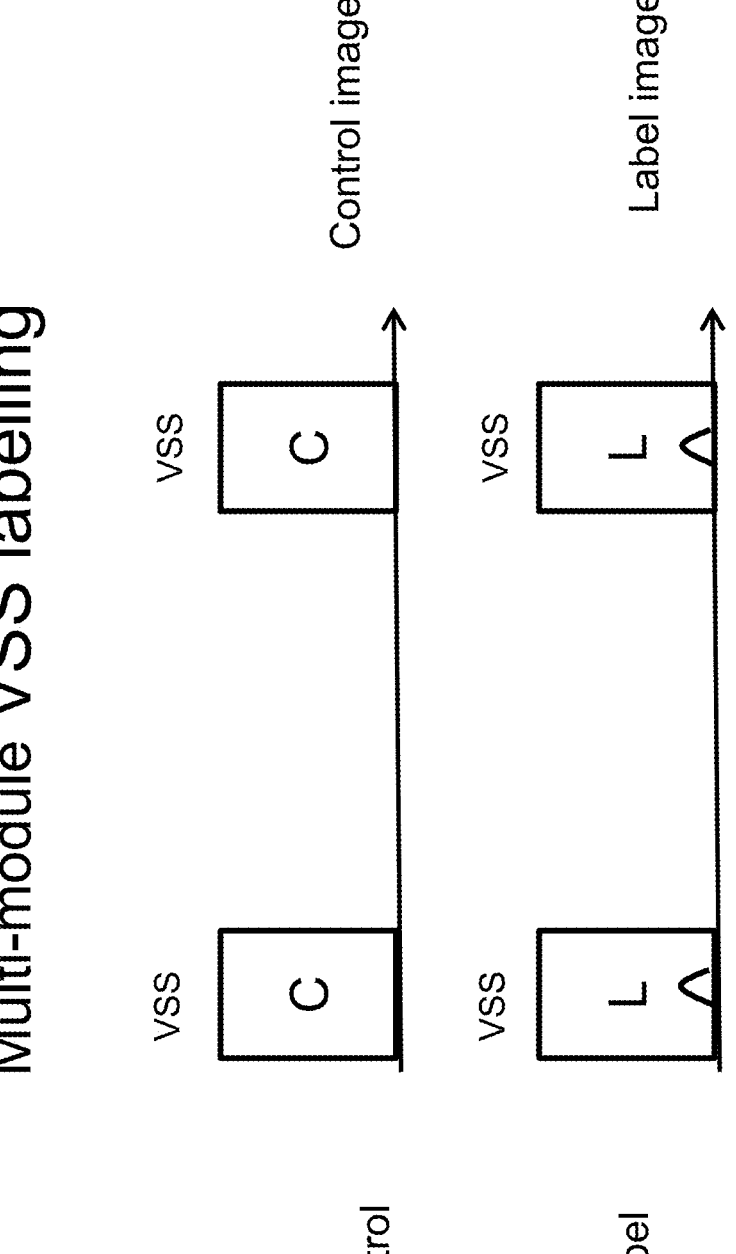
FIG. 14 shows an example of a conventional multi-module velocity-selective arterial spin labeling (MM-VSASL) imaging process using two velocity-selective saturation (VSS) pulse modules.

FIG. 14 shows an example of a conventional velocity-selective saturation (VSS) imaging process using two pulse modules. A control image (top) is obtained by applying, in a control condition, a control VSS module, followed by a second VSS control module. In the labeling condition, a first labeling module is applied, followed by a second labeling module to obtain a labeling image. Typically, VS gradient pulses are applied under the labeling condition, but are turned off under the control condition. The ASL image signal is recovered as a difference between the control image and the labeling image. In addition to the C and L modules (representing control and labeling), gradient pulses are shown as pulses under the L pulse time rectangles.

With respect to FIG. 14 module arrangements, typically, the VSS process shown in FIG. 14 exhibits an increase of ASL signal compared to a single-module VSS labeling process, and a very robust labeling in real-world scenarios when a robust VSS module, such as a symmetric eight-segment B1-insentivity rotation (symBIR-8) pulse train, is used, where application of pulses is relatively immune to influence from surrounding tissue and magnetic field conditions.

Figure 15:
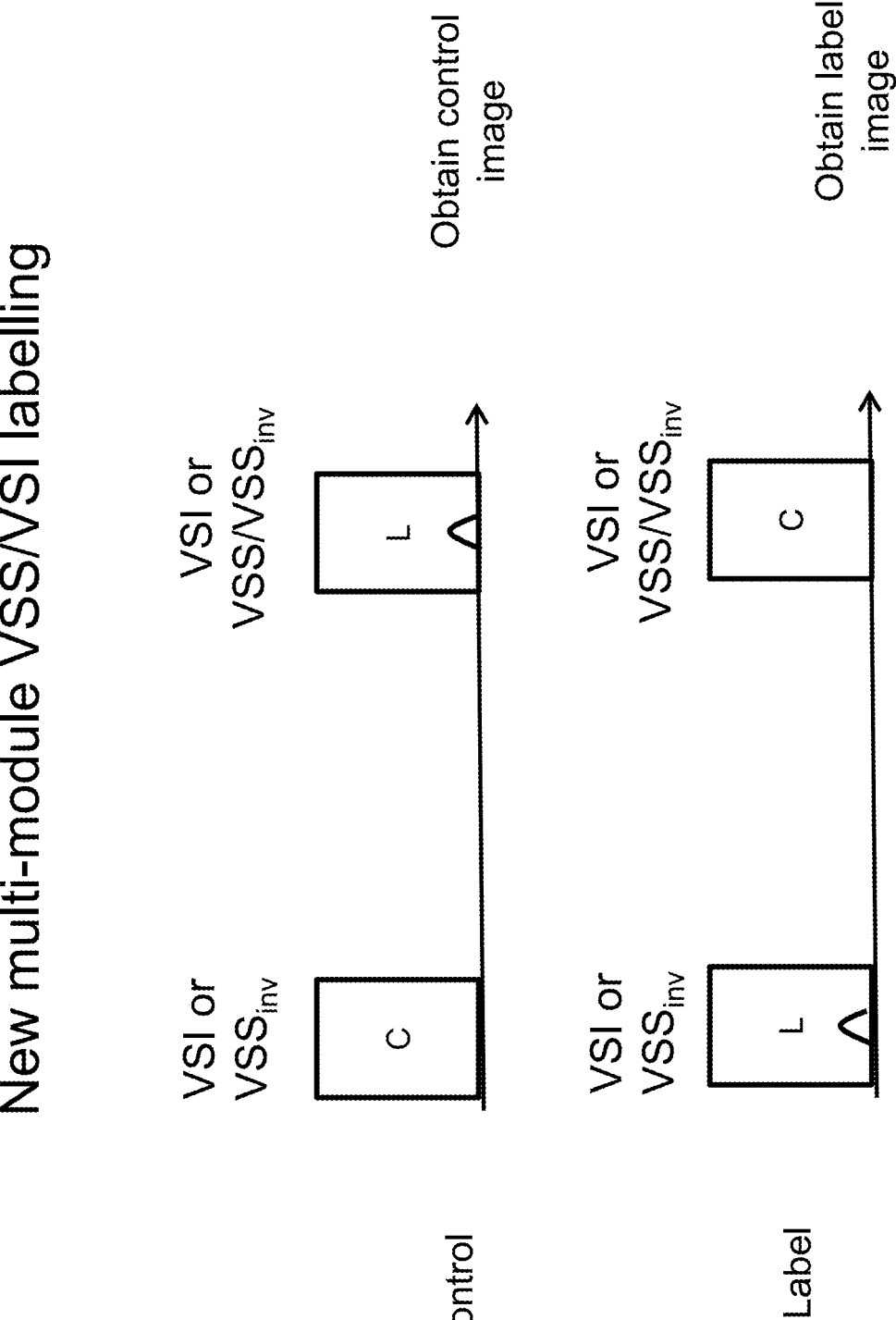
FIG. 15 shows an example of a new MM-VSASL imaging process using two VS inversion (VSI) or VSS (or VSS with built-in inversion, $VSS_{inv}$) pulse modules.

FIG. 15 shows an example of the new MM-VSASL imaging process using two pulse modules. This process uses VSS with built-in inversion ($VSS_{inv}$) or VSI in the application of magnetic pulses. In the depicted embodiment, a control image is obtained by applying a sequence of a control module followed by a labeling module and, during labeling condition, a labeling module is applied followed by a control module. In this embodiment depicted in FIG. 15, compared to the FIG. 14 arrangement, the first VS pulse module (VSS$_{inv}$ or VSI) naturally inverts the magnetization of static tissues in a target, and therefore the control and labeling conditions are switched in a different order in the second VS pulse module. The gradients are more balanced between the label and the control conditions that leads to better temporal SNR (tSNR), as the arrangement mitigates or reduces the eddy current effects and the diffusion effects that are typically observed by application of gradient pulses in VS labeling.

For dm-VSI labeling: The first VSI pulse is applied under a label (or control) condition, after some time, a second VSI pulse is applied with the label/control condition opposite to the first VSI module, i.e., control (or label). Then ASL images can be acquired after some delay.

For the proposed new dm-VSS labeling: The first VSS is applied with a built-in inversion (VSS$_{inv}$), which can be implemented in several ways, such as adding a phase of π to the last segment of the symmetric B$_1$ insensitive rotation BIR-8 (sBIR8) pulse. Then the second VSS is applied with a flipped label/control condition, with or without the built-in inversion.

In various embodiments, dm-VSASL using VSS and VSI: VSS+VSI, VSI+VSS and their inverted variants may be implemented. Label/control condition should be flipped in the second VS module when the first VS labeling inverts stationary spins.

Alternatively, the inversion effect from the first VS module can be realized using additional inversion pulses after the VS labeling pulse. For example, an inversion pulse can be applied after the first regular VSS pulse to allow a VSS$_{inv}$-equivalent VS labeling.

Figure 16:
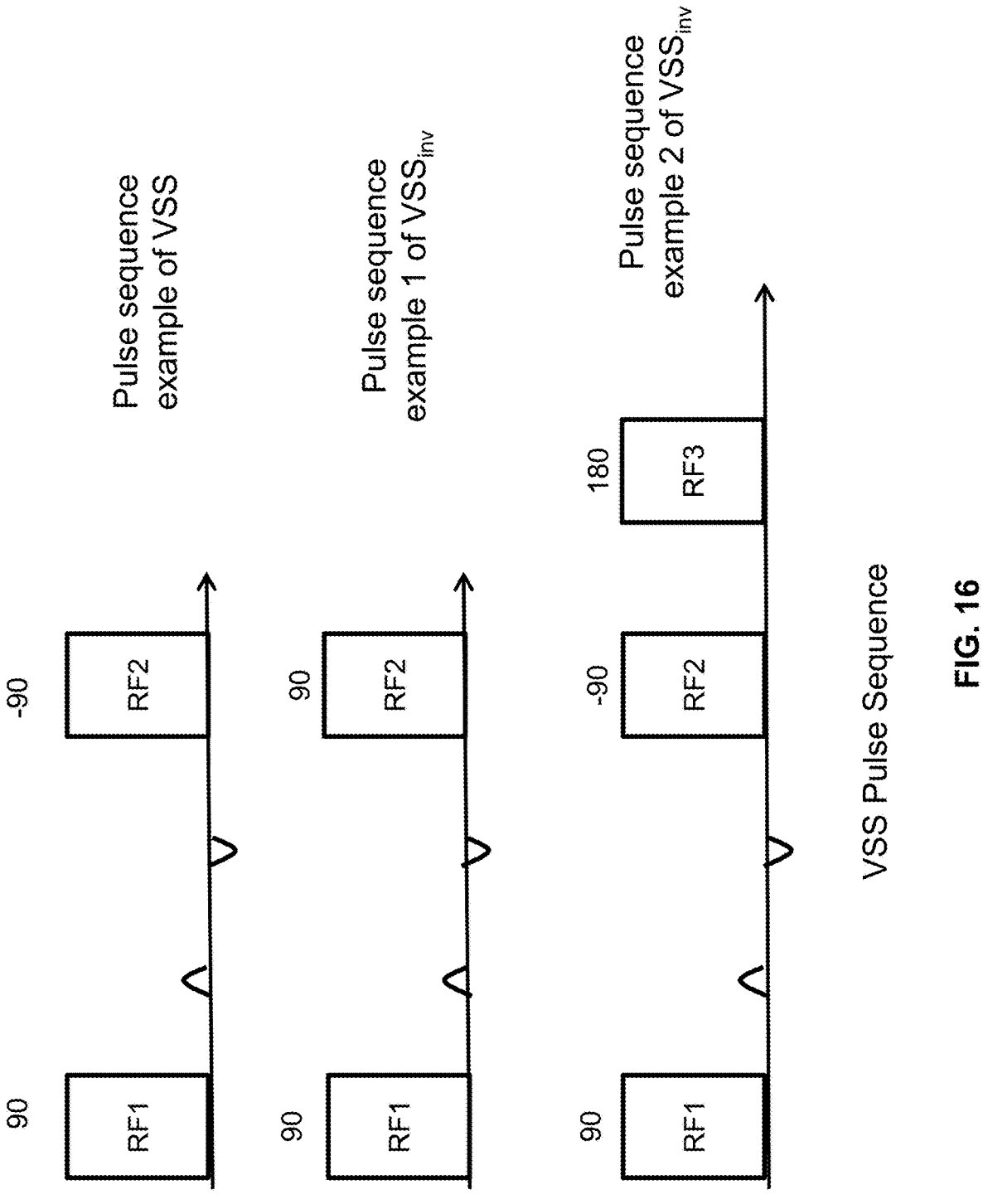
FIG. 16 shows examples of modifying a VSS pulse module into a $VSS_{inv}$ pulse module.

FIG. 16 shows an example of modifying a VSS module into a VSS$_{inv}$ module. The timeline on the top shows a simplest pulse sequencing example of a VSS process in which the two RF pulses are applied with +90-degree and −90-degree rotations and gradient pulses to labeling moving spins by saturation, while keeping stationary spins at equilibrium. VSS$_{inv}$ may be achieved by adding a 180-degree phase to the second RF pulse in the VSS module (e.g., apply a +90-degree rotation). Alternatively, or in addition, inversion pulses (e.g., 180-degree RF pulse) may be applied at a time after the VSS module to cause the inversion of stationary spins. In the case of labeling using VSI module, since it inverts stationary spins by default, the VSI module can be directly applied in this new multi-module VSASL process without additional modification.

Figure 17:
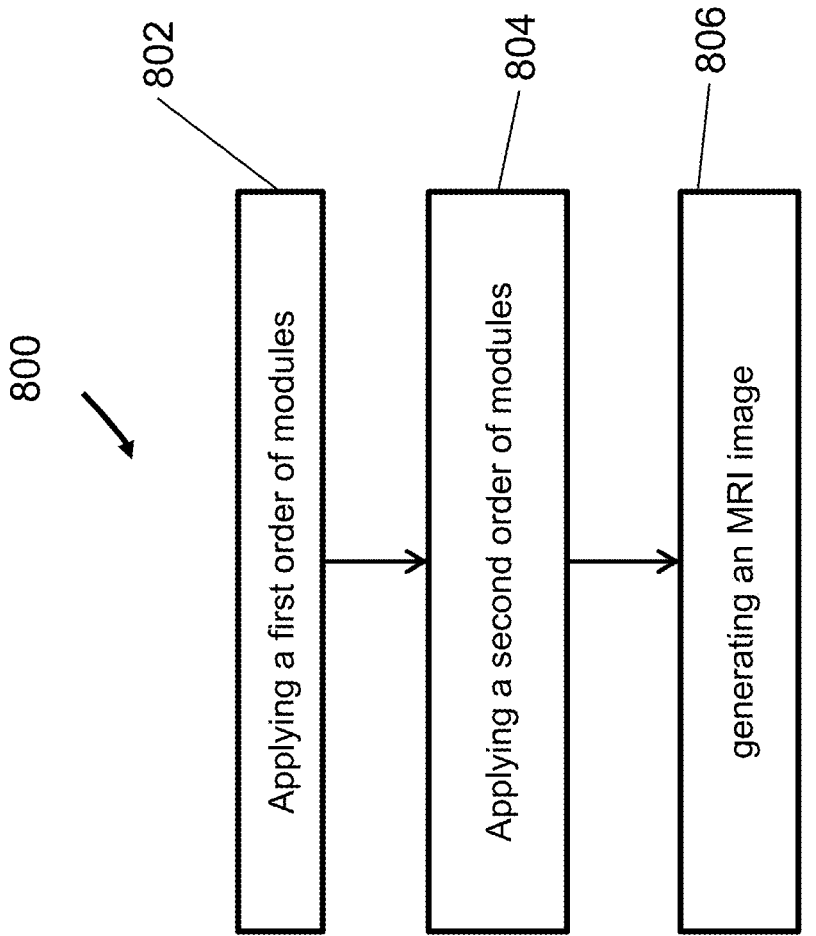
FIG. 17 is a flowchart of an example method of operating an MRI system.

FIG. 17 is a flowchart of an example method 800 of operating an MRI system. The method 800 includes generating (806) an MRI image by processing a first image obtained by applying (802) a first order of modules including at least a first control module at a first time point and a first labeling module at a second time point to a target object, wherein the first control module inverts a magnetization of the target object and a second image obtained by applying (804) a second order of modules including at least a second labeling module at a third time and a second control module at a fourth time to the target object, wherein the second labeling module inverts the magnetization of the target object.

In some embodiments, the first module and the second modules are applied using gradient coils that are communicatively coupled to a processor that controls their operation. In some embodiments, the first and second images are generated using a scanner that captures the resulting magnetic field intensities. In various embodiments described in the present document with reference to FIGS. 14 to 17 and FIGS. 18-19, the first module and the second module may use the dual module (dm) VSASL technique described herein. For example, in some embodiment, a vascular crushing module (VCM) may be used, e.g., as described with reference to FIGS. 12 and 19.

2. DUAL-MODULE VELOCITY-SELECTIVE ARTERIAL SPIN LABELING (DM-VSASL) EMBODIMENT EXAMPLES

Velocity-selective arterial spin labeling (VSASL) is insensitivity to inhomogeneous transit times. It demonstrated great promise in clinical imaging of perfusion with long delays. Dual-module (dm-) VS saturation (dm-VSS) and VS inversion (VSI) preparation have been developed to improve the signal-to-noise ratio (SNR) efficiency of VSASL. However, the temporal SNR (tSNR) of VSASL methods was not satisfactory in practice. Though recent studies compared the tSNR of different VSASL methods without background suppression (BS), an investigation on the tSNR performance of VSASL with BG is of high interest to the community. A novel dual-module labeling strategy is introduced to enable dual-module labeling for both VSS and VSI with improved SNR efficiency.

The new dm-labeling strategy uses VS pulses that invert the stationary spins as the first VS module, and then switch the label/control condition in the second VS module to allow proper accumulation of ASL signal in the tissue. This results in a more balanced utility of VS gradients under the label/control conditions. See, e.g., FIG. 15. This should reduce noise and artefacts from sources such as motion, eddy currents (EC) and diffusion.

In some embodiments, sinc-VSI was used for dm-VSI labeling. For dm-VSS labeling, symmetric BIR-8 (sBIR8) pulse was used with a phase of π added to the last segment to invert the stationary spins (VSS$_{inv}$). VSS$_{inv}$ was also used when its inversion effect can be used for BS.

3.1 Introduction

Velocity-selective ASL (VSASL) is insensitive to inhomogeneous arterial transit times (ATT) among ASL methods, offering an SNR advantage when ATT is long. VS saturation (VSS) based labeling has relatively low signal-to-noise ratio (SNR). Recent development on improving the SNR includes: 1) multi-module VSS preparation, and 2) VS inversion (VSI) preparation. An SNR improvement in the range of 20-30% compared to single-module (sm-) VSS based preparation has been reported using both methods. A novel labeling strategy is invented to enable dual-module (dm-) VSI labeling to further improve the SNR efficiency, which also benefits VSS labeling.

3.2 Theory and Methods

Figure 18:
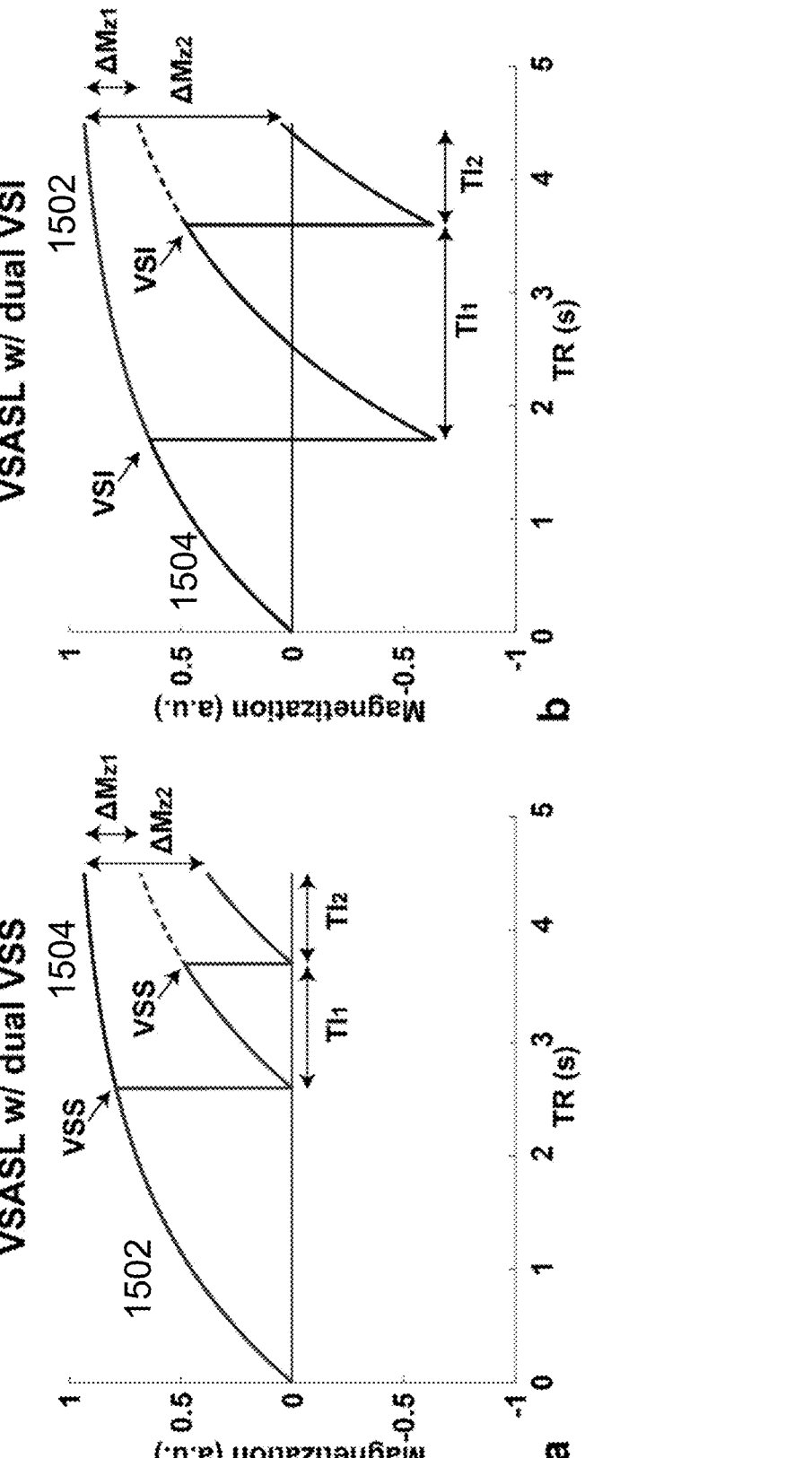
FIG. 18 shows an example of evolution of the arterial magnetization for dual-VSS and dual-VSI.

Similar to the dm-VSS preparation, two groups of spins are considered for dm-VSI: 1) one labeled by only the first VS module; 2) one labeled by both VS modules. The evolution of the magnetization for dual-VSS and dual-VSI is shown in FIG. 18, and Sig$_{ASL}$∝ΔM$_{z1}$·TI$_1$+ΔM$_{z2}$·TI$_2$. In FIG. 18, left graph, magnetization (vertical axis) as a function of TR (horizontal axis) is shown for VSASL with dual VSS, while the right graph shows magnetization as a function of TR for VSASL with dual VSI.

Dm-VSI labeling: VSI pulses invert the stationary spins, therefore flipping the label/control condition in the second VSI is required to avoid signal canceling. Additional benefits include: 1) the sensitivity to motion, diffusion attenuation and eddy current (EC) effects are better balanced in the label/control images, potentially reducing artefacts and improving quantification accuracy; 2) the inversion effects allow more efficient background suppression (BS).

Dm-VSS labeling: 1) VSS+VSS as described previously; 2) $VSS_{inv}$+VSS or $VSS_{inv}$+$VSS_{inv}$ to allow a more balanced label/control design as described above. $VSS_{inv}$ can be implemented in several ways, such as adding a phase of $\pi$ to the last segment of the symmetric BIR-8 (sBIR8) pulse.

Dm-VSASL using VSS and VSI: VSS+VSI, VSI+VSS and their inverted variants. Label/control condition should be flipped in the second VS module when necessary.

FIG. 18 shows an example of evolution of the magnetization of the moving spins under the label (1502) and the control (1504) conditions for dual-module VSS (a) and dual-module VSI (b) preparations. Under the label condition, the spins labeled by only the first VS module and by both VS modules follow the red solid and red dashed lines, respectively. Note that for simplicity and visual clarity, the inversion effect on $\Delta M_{z1}$ from the second VSI module is not shown in (b).

Figure 12:
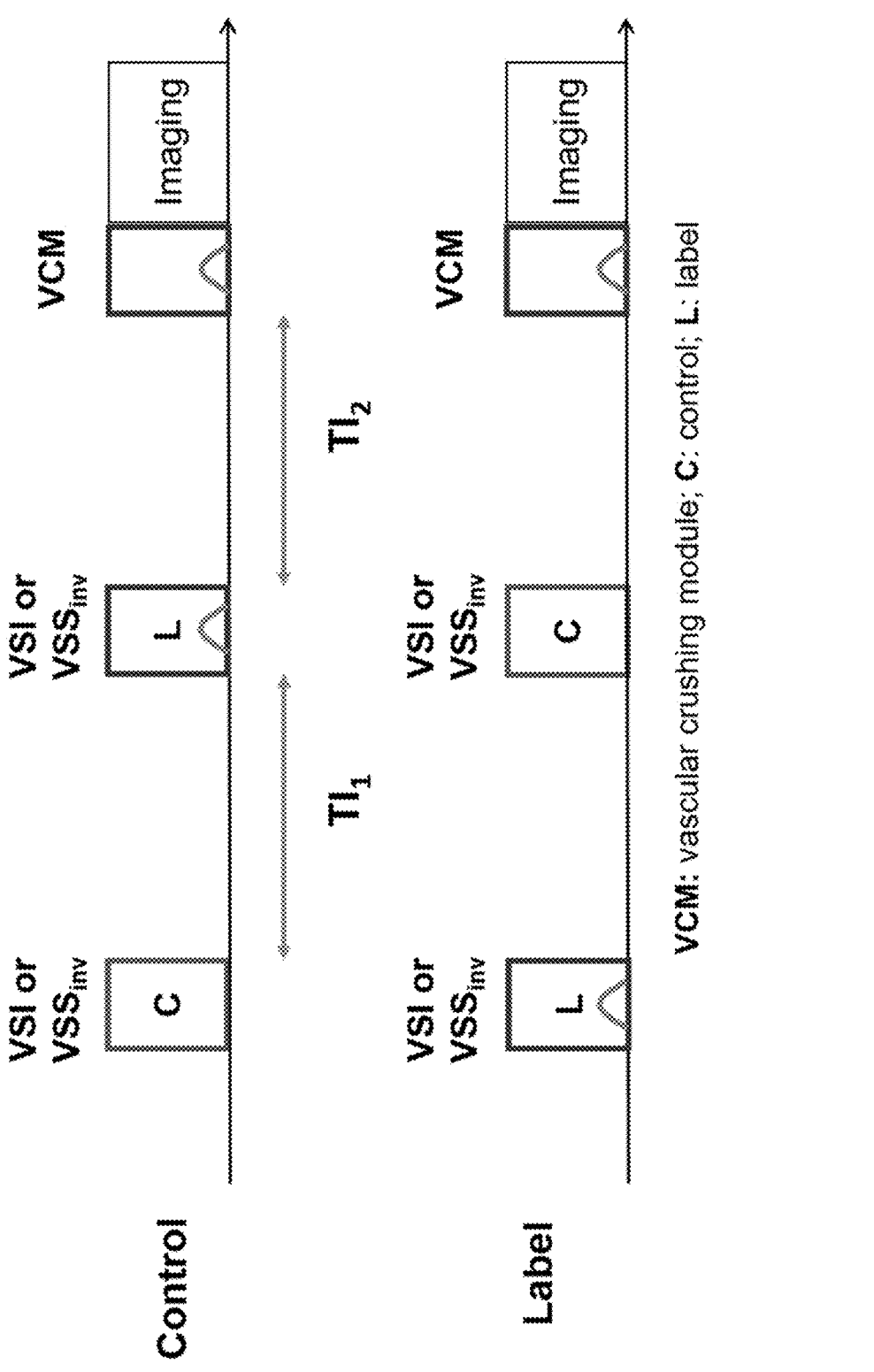
FIG. 12 shows an example of the proposed dual-module velocity-selective (VS) labeling without additional BS pulse.

FIG. 12 shows an example of the proposed dual-module VS labeling. The top graph shows application of control pulses. A first module is a VSS or a $VSS_{inv}$ module, followed by a VSI or VSS/$VSS_{inv}$ module with a TI1 time separation. After TI2 time, a VCM module may be applied. During the TI2 interval background suppression pulses may be applied. The lower graph shows labeling scheme (time coincident with the top graph). First label module may be a VSI or $VSS_{inv}$ module, followed by a VSI or VSS/$VSS_{inv}$ module. At the end of the VCM module, imaging may be performed to obtain MRI images.

3.3 Discussion of Differences Between VSASL and Dm-VSASL

As described herein, traditional VSASL (single-module VSASL, or sm-VSASL) has different gradient layouts, and thus unbalanced diffusion and EC sensitivities, in the acquisition of label and control images; and mm-VSASL has improved SNR efficiency, but the diffusion and EC sensitivities are higher; that is, 2 VS modules under the label condition (with flow-sensitizing gradients) are used to acquire label images. To tackle this, the dm-VSASL design rearranges the flow-sensitizing gradients in the acquisition of label and control images such that the diffusion and EC sensitivities are better balanced in the 2; therefore, the associated artifacts can be reduced or canceled after subtraction. Similar to mm-VSASL, dm-VSASL uses more than 1 VS labeling module in preparation, but they differ in a few important aspects: (1) mm-VSASL is applicable with VSS labeling only, whereas dm-VSASL can use both VSS and VSI labeling and their combinations; (2) dm-VSASL uses a different gradient configuration to acquire label and control images; (3) dm-VSASL requires the first VS module to invert the static spins, whereas mm-VSASL does not.

Figure 19:
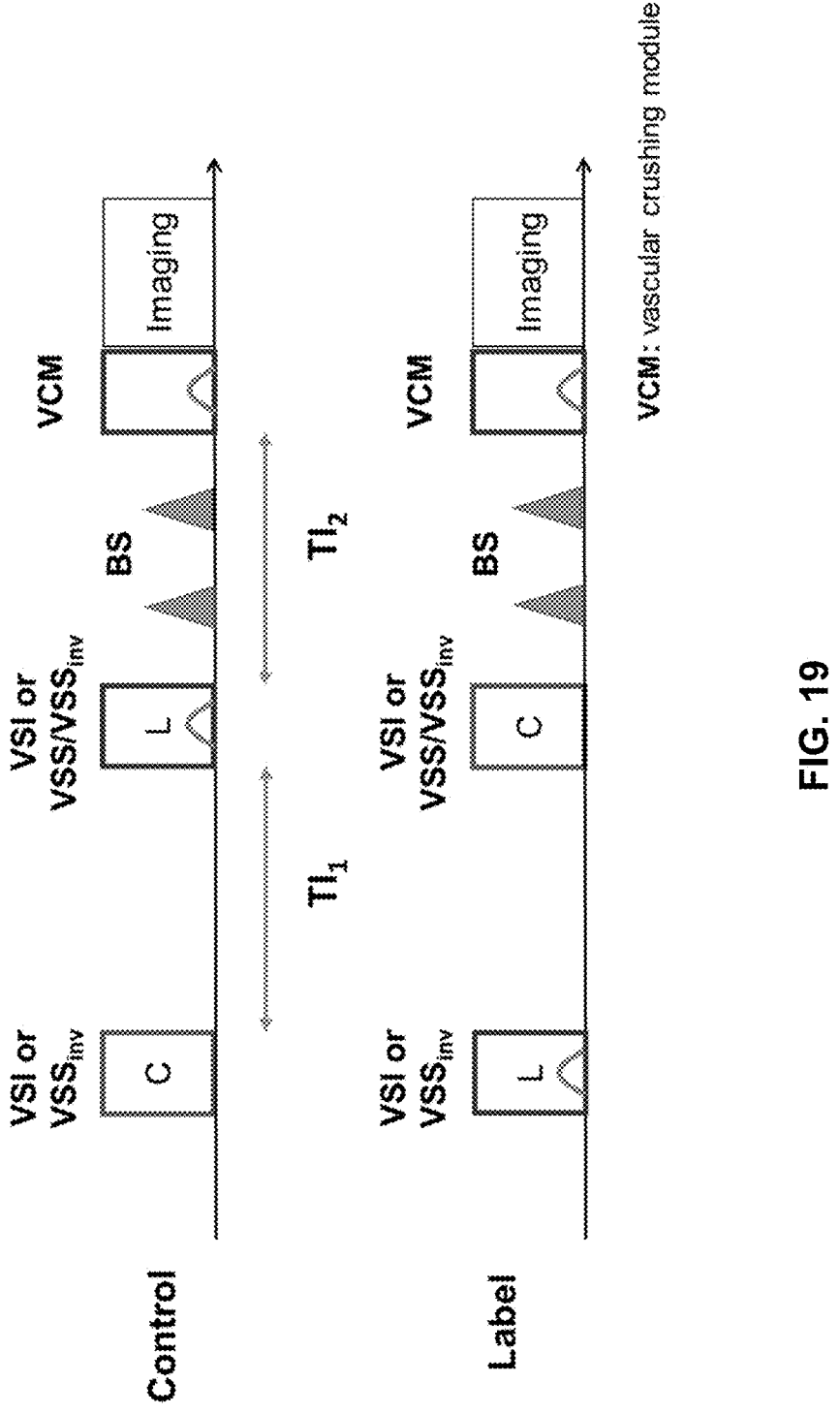
FIG. 19 shows an example of a typical background suppression strategy for two VSI or $VSS_{inv}$ pulse modules.

Below we start with the implementation of dm-VSASL to demonstrate the design principles as illustrated in FIG. 19. Briefly, a global saturation is first applied to reset the magnetization of all spins to a known state ($M_z$=0). After a delay time of $T_{sat}$ (e.g., 2 s) for the arterial spins to recover, 2 VS modules are applied consecutively with a delay (on the order of 1 s) after each to allow arterial inflow to deliver. The types of the VS modules (VSS vs. VSI) and the conditions (label vs. control) depend on the specific implementation and the image type being acquired (label vs. control), as described in the details below. Then a VCM is applied to remove undelivered (i.e., with $V>V_{cut}$) spins and followed by image acquisition after a short PLD (close to zero). Additional BS pulses can be applied between the second VS module and the VCM.

FIG. 19 shows the new dual-module VSASL scheme, where the VS modules under the control condition are labeled with C (blue), and the ones under the label condition are labeled with L (red), with green shapes representing flow-sensitive gradient pulses. The pulse sequence diagram on the top is for acquiring a control image and the diagram at the bottom for acquiring a label image. $TI_1$ and $TI_2$ are the time between the 2 VS modules, and between the second VS module and the VCM. BS, background suppression; PLD, post-labeling delay; VCM, vascular crushing module; VSASL, velocity-selective arterial spin labeling; VSI, velocity-selective inversion; VSS, velocity-selective saturation; $VSS_{inv}$, velocity-selective saturation that can invert stationary magnetization.

3.4 Dm-VSASL Using VSI Only

To acquire a control image, the first VSI module is applied under the control condition, that is, without flow-sensitive gradients. After a delay of $TI_1$, the second VSI module is applied under the label condition, that is, with the flow-sensitive gradient pulses. After a second delay time $TI_2$, the VCM can be applied and followed by PLD and image acquisition. To acquire a label image, the first VSI module is applied under the label condition, and the second module under the control condition. Background tissue signals are partially suppressed by the inversion effect of the VSI modules, and the SNR is improved. Additional global BS pulses can be applied after the second VSI module to further improve the SNR.

3.5 Dm-VSASL Using VSS Only

Unlike the previous mm-VSASL, where 2 VSS modules under the same condition are applied consecutively to acquire a label or a control image, dm-VSASL using VSS only obtains a control image with the first VSS module under the control condition and the second module under the label condition, and a label image with the first VSS module under the label condition and the second module under the control condition. In addition, the first VSS module has to be modified to invert the magnetization of static spins. To differentiate it from the unmodified VSS module, this is denoted as $VSS_{inv}$. The second VSS module can be either VSS or $VSS_{inv}$.

$VSS_{inv}$ can be implemented in 2 ways: (1) applying an inversion pulse immediately after the VSS module, or (2) modifying the phase of the RF pulses in the VSS module to induce a built-in inversion effect; for example, a phase of $\pi$ can be added to the last RF pulse in a double-refocused hyperbolic secant/tangent or a symmetric 8-segment $B_1$ insensitive rotation (sBIR8) module to tip the static spins down instead of up. The $VSS_{inv}$ module with built-in inversion is preferred because: (1) it does not increase the specific absorption rate; and (2) no addition signal reduction is introduced. Like VSI, $VSS_{inv}$ effectively serves as a BS pulse whose inversion effect should be accounted for in BS timing calculation.

3.6 Dm-VSASL Using Both VSS and VSI

Combinations of VSS and VSI modules, such as VSI+VSS/$VSS_{inv}$ and $VSS_{inv}$+VSI, are also feasible. For example, a VSI module followed by a VSS or VSS$_{inv}$ module, or a VSS$_{inv}$ followed by a VSI module, would also work under the principles of dm-VSASL.

Note that for the dm-VSASL implementations described above, the label/control condition switching is required for proper accumulation of ASL signal (see below). Otherwise, the ASL signal created by the 2 VS modules will have opposite signs, resulting in signal reduction or even cancellation.

Compared to sm-VSASL and mm-VSASL, dm-VSASL has a more balanced gradient configuration between the label and the control image acquisition. This arrangement should mitigate the eddy current and the diffusion attenuation effects that are typically observed in VSASL, as well as reducing its sensitivity to motion, potentially reducing artifacts and improving quantification accuracy. In addition, the inversion effects at an early time allow more flexible and efficient BS. All these should contribute to improving the labeling stability, the tSNR, and the quantification accuracy of VSASL.

3.7 Dm-VSASL Signal Modeling and Blood Flow Quantification

Similar to the previous mm-VSASL signal modeling, 3 groups of arterial spins are considered in dm-VSASL: (1) group 1 being labeled by only the first VS module, that is, it is in the transmit field of the RF coil and moves above V$_{cut}$ at the application of the first VS module and has decelerated below V$_{cut}$(delivered) at the application of the second VS module; (2) group 2 being labeled by both VS modules, that is, in the range of the RF coil and moving above V$_{cut}$ at the application of both VS modules; and (3) group 3 being labeled only by the second VS module, that is, moving into the transmit field of the RF coil after the first VS module. Since group 3 is not likely to contribute to the measured ASL signal when TI$_1$+TI$_2$<BD$_{max}$ (BD$_{max}$ is the maximal bolus duration, on the order of 2 s) and including it complicates the quantification, only the first 2 groups are included in the following modeling.

Figure 20:
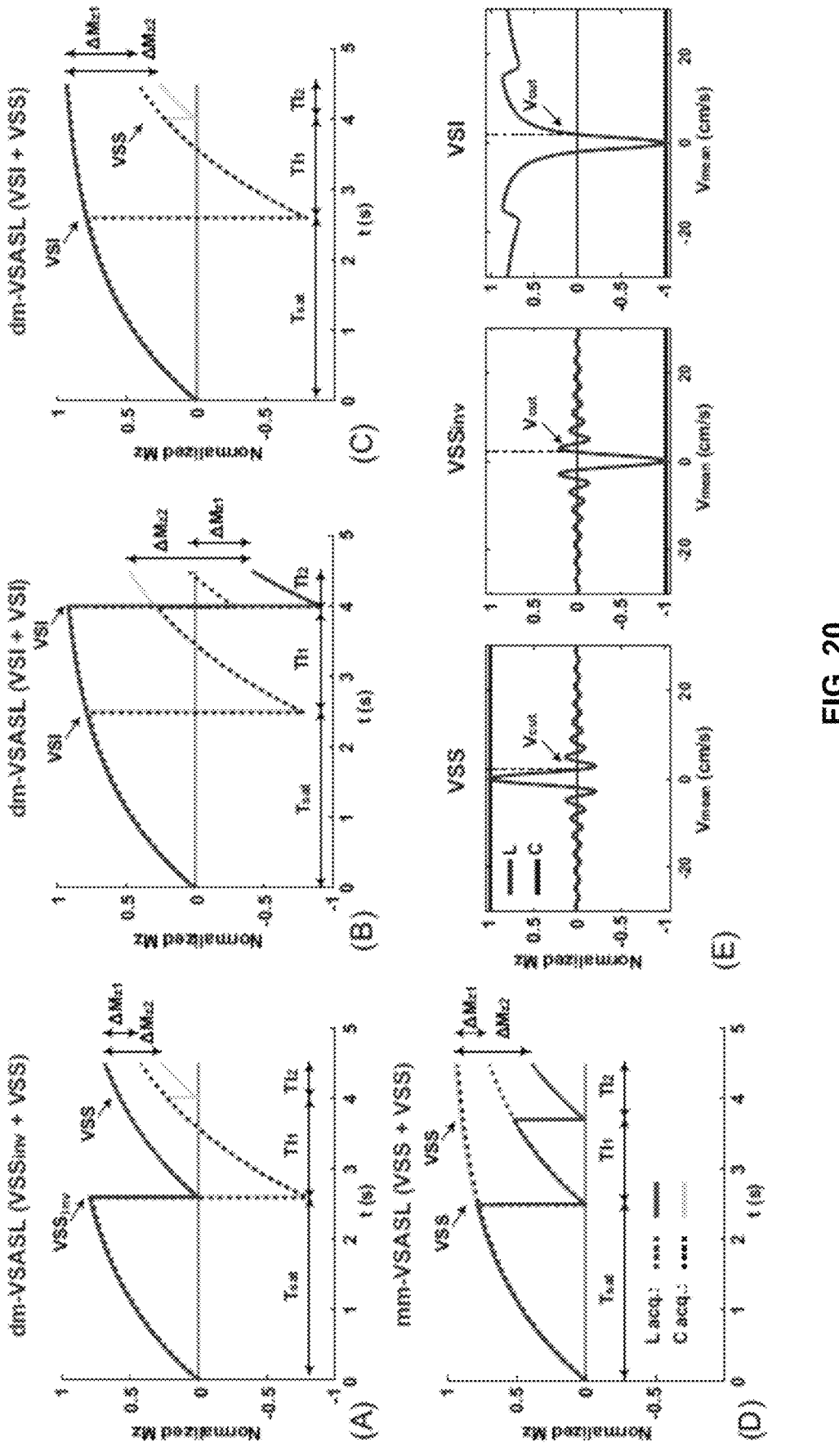
FIG. 20 shows the magnetization evolution of various dm-VSASL embodiments with and without label/control switching.

FIG. 20 shows the magnetization evolution of the proposed dm-VSASL with label/control switching using VSS$_{inv}$+VSS (A), VSI+VSI (B) and VSI+VSS (C); and the pervious mm-VSASL (no label/control switching) using VSS+VSS (D); (E) the M$_z$ vs. V$_{mean}$ profiles of VSS, VSS$_{inv}$ and VSI labeling after convolving with a laminar flow distribution with the V$_{cut}$ shown (label is the squiggly curve, control is the linear curve). In panels A-D, the group of arterial spins seeing only the first VS module is shown in dashed lines (group 1), and the group seeing both VS modules is shown in solid lines (group 2). The magnetization evolution in the label image acquisition is shown in different patterns (group 1: upper dashed curve; group 2: upper solid curve), and that in the control image acquisition is shown in cool colors (group 1: lower dashed curve; group 2: lower solid curve). The curves in A-D are shifted slightly for better visualization, and only T$_1$ relaxation effect was included. Note that the label/control condition in the second VS module is switched in A, B and C, such that the ASL signals from groups 1 and 2 (ΔM$_{z1}$ and ΔM$_{z2}$) are of the same sign.

The present document discloses a new method that addresses the above technical challenges of BS in VSASL, among others. This new BS method uses the inversion effect of the labeling modules themselves to suppress the MR signals of brain tissues, therefore, eliminating the need to apply additional RF pulses to suppress the tissue signals (e.g., FIG. 12). In the brain, this method can effectively suppress the MR signals of all static tissue types, including gray and white matters, and CSF, significantly reducing the noise contribution from these tissues, and improving the SNR of VSASL. Since no additional RF pulses are used, less RF energy will be needed in VSASL scans. This improves the safety and the comfort of the subject/patient. This is particularly important in implementing dm-VSASL at ultra-high fields, where RF energy constraint limits the use of high-energy pulses and the number of RF pulses.

4. DISCUSSION ABOUT BS PULSES

Although dm-VSASL provides very good quality SNR and arterial transit time (ATT) insensitivity, its BS should be optimized to maximize its SNR performance. T2 relaxation effects in VSASL labeling modules should be included in BS optimization, and can be modeled by: $e^{-eTE/T_{2,i}}$ (i=GM/WM/CSF).

Some of the design considerations for VSASL BS include:

1) the timing of BS pulses is based on the timing of VS modules for optimal ASL signal;
2) good suppression of CSF signal;
3) using as few additional BS pulses as possible;
4) avoiding rectification errors (e.g., complex recon)

FIG. 1 shows an example ASL MRI image showing rectification errors, shown by arrow in the top row ASL images with magnitude image reconstruction, and the corresponding bottom row images based on complex image reconstruction.

Figure 3:
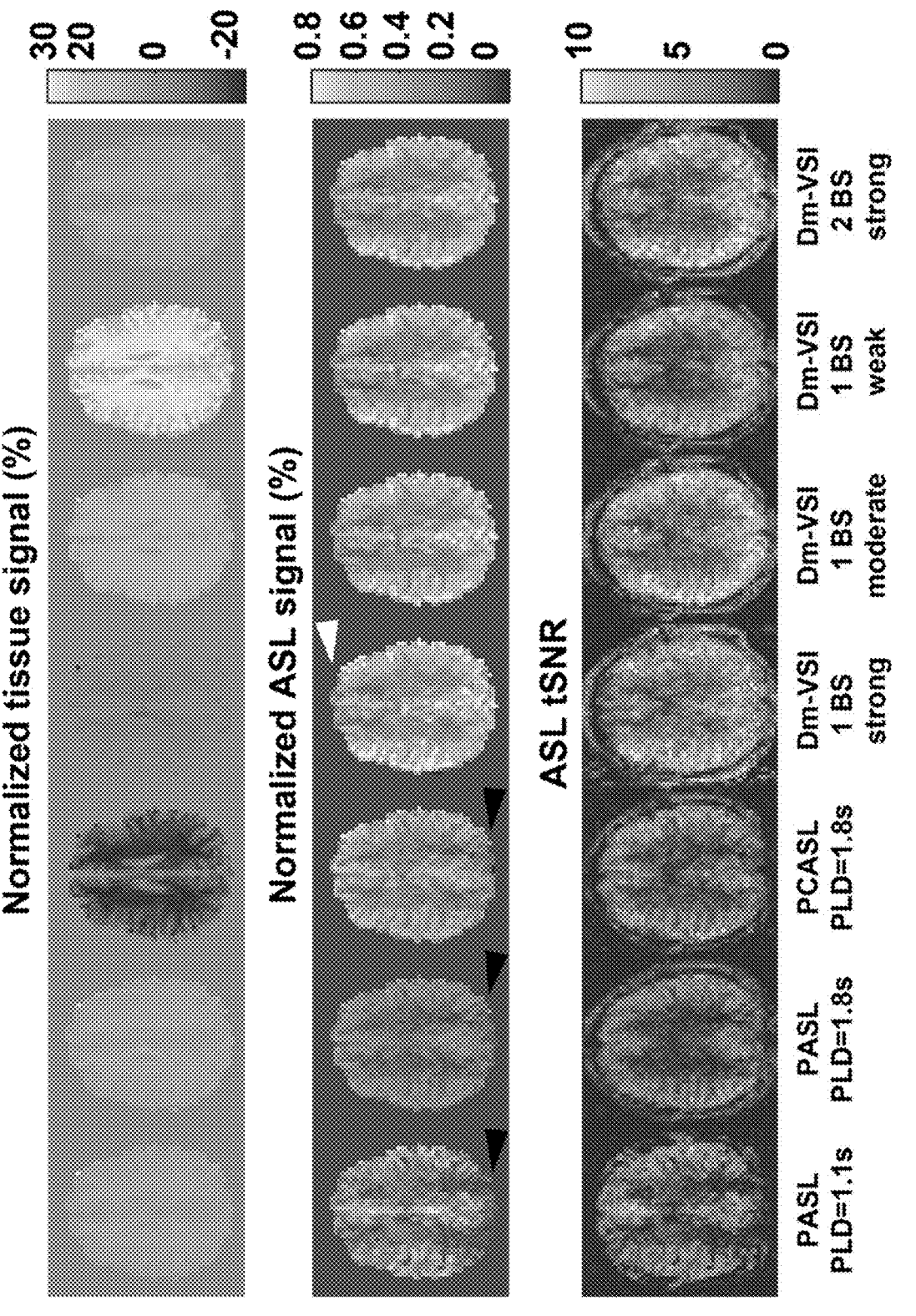
FIG. 3 is an example of background tissue, ASL signal and temporal SNR images.

FIG. 3 is an example of ASL images with additional BS pulses. In the experiment, a 3 T scanner was used on 3 healthy subjects. The rows show normalized tissue signal percent (top), normalized ASL signal percent (middle) and ASL tSNR (bottom) for multiple schemes along different columns:

Pulsed Arterial Spin Labeling (PASL, product, FAIR with Q2Tips): Short post-labeling delay PLD: TI$_1$/TI=0.7/1.8 s, 2 BS (TI$_{1/2}$=1150/370 ms); Long PLD: TI$_1$/TI=0.7/2.5 s, 2 BS (TI$_{1/2}$=1400/420 ms).

Pseudo-continuous ASL, PCASL (product): 4 BS pulses (TI$_{1/2/3/4}$=1260/350/335/80 ms), LD/PLD=1.8/1.8 s.

Dm-VSASL (sinc-VSI labeling modules) with:
1 BS pulse: strong (TI=110 ms); moderate (TI=260 ms); weak (TI=410 ms);
2 BS pulses: strong (TI$_{1/2}$=480/350 ms).

Figure 2:
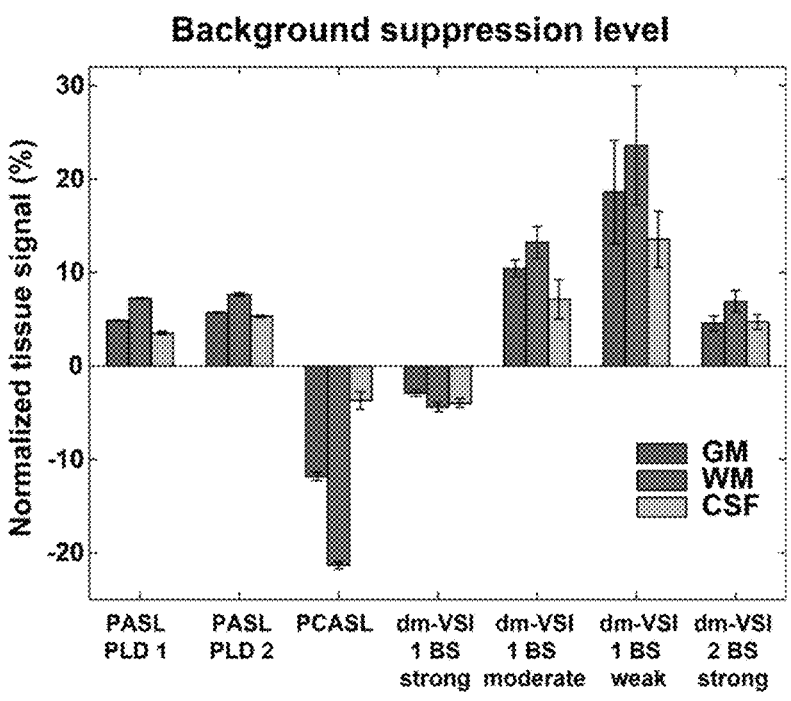
FIG. 2 shows an example of background tissue signal comparison using various ASL methods and background suppression (BS) schemes.
Figure 4:
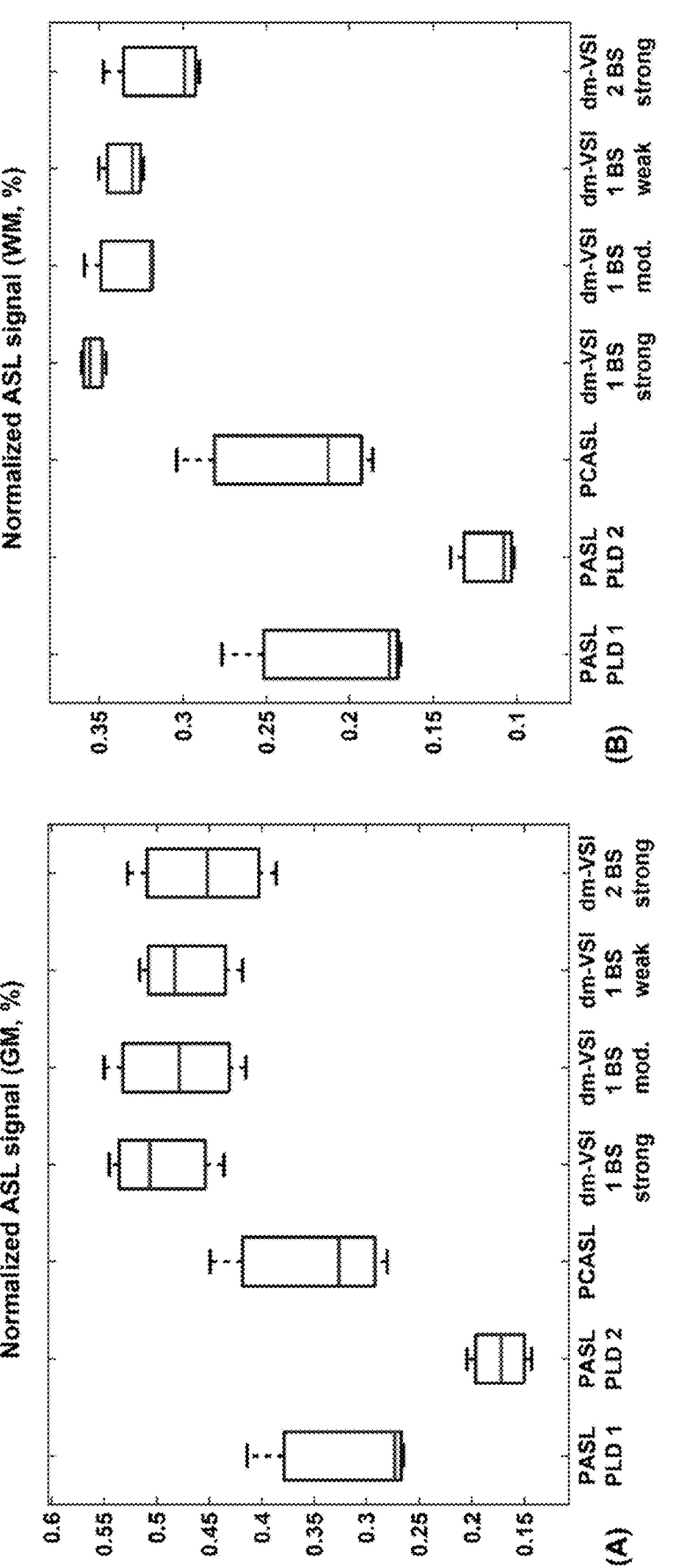
FIG. 4 shows an example of ASL signal comparisons.

FIG. 2 and FIG. 4 show examples of background tissue and ASL comparisons for the experiments in FIG. 3.

Figure 5:
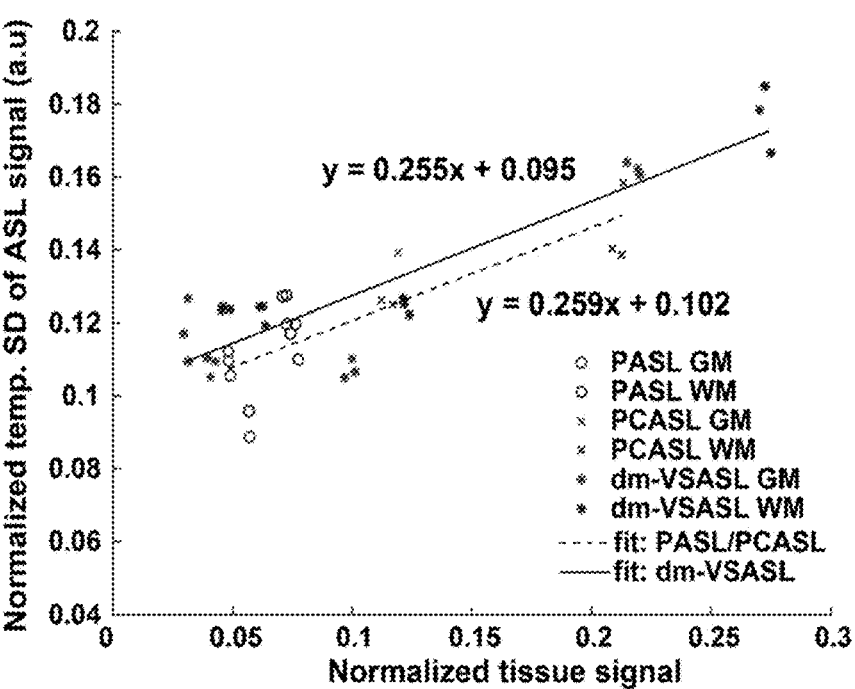
FIG. 5 is a graph demonstrating the correlation between temporal noise and tissue signals.

FIG. 5 is a graph demonstrating the correlation between temporal noise and tissue signals. It can be seen that temporal noise linearly correlates to tissue signal. Also, relationships almost identical between PASL/PCASL and VSASL.

Figure 7:
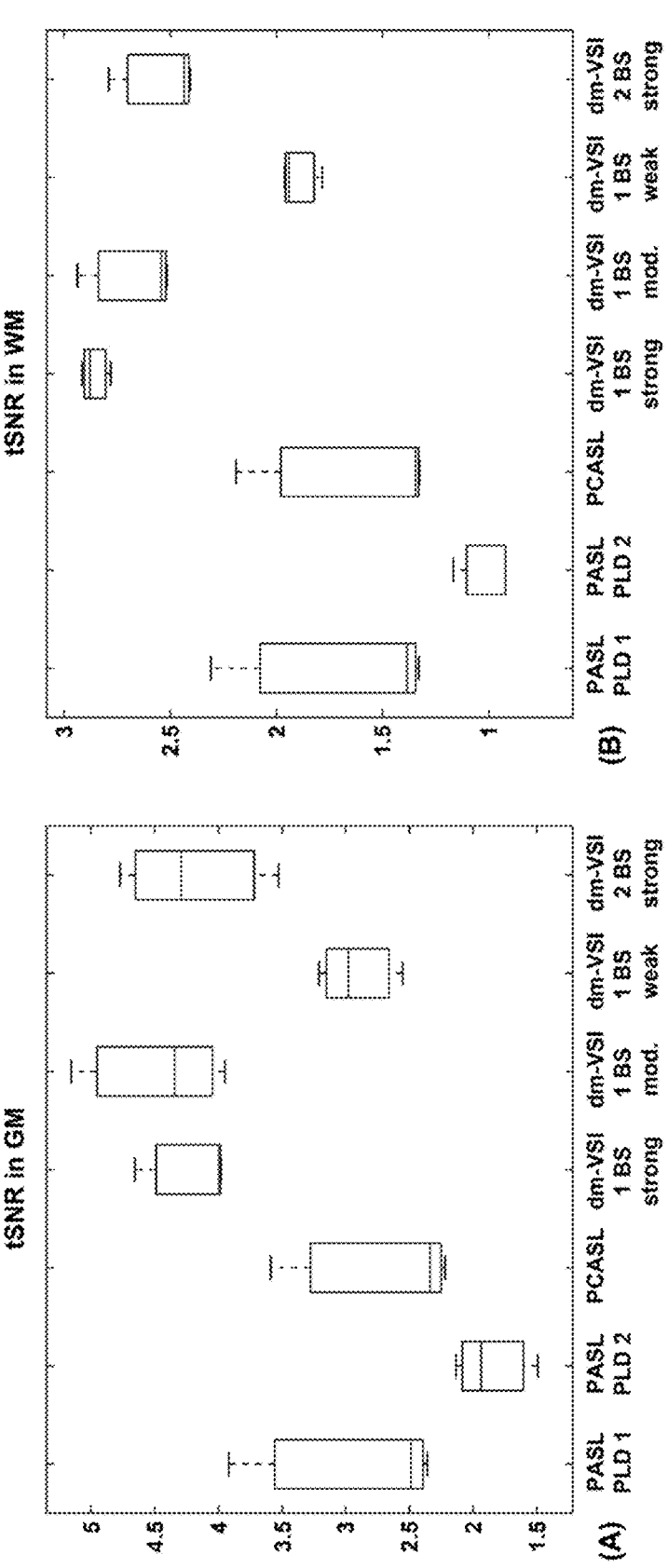
FIG. 7 is an example of temporal signal to noise ratio (tSNR) for various ASL methods and BS schemes.

FIG. 7 is an example of temporal signal to noise ratio (tSNR) for various ASL and BS schemes. Here, it may be seen that dm-VSASL with moderate or strong BS provides significantly higher tSNR than PASL and PCASL.

Figure 8:
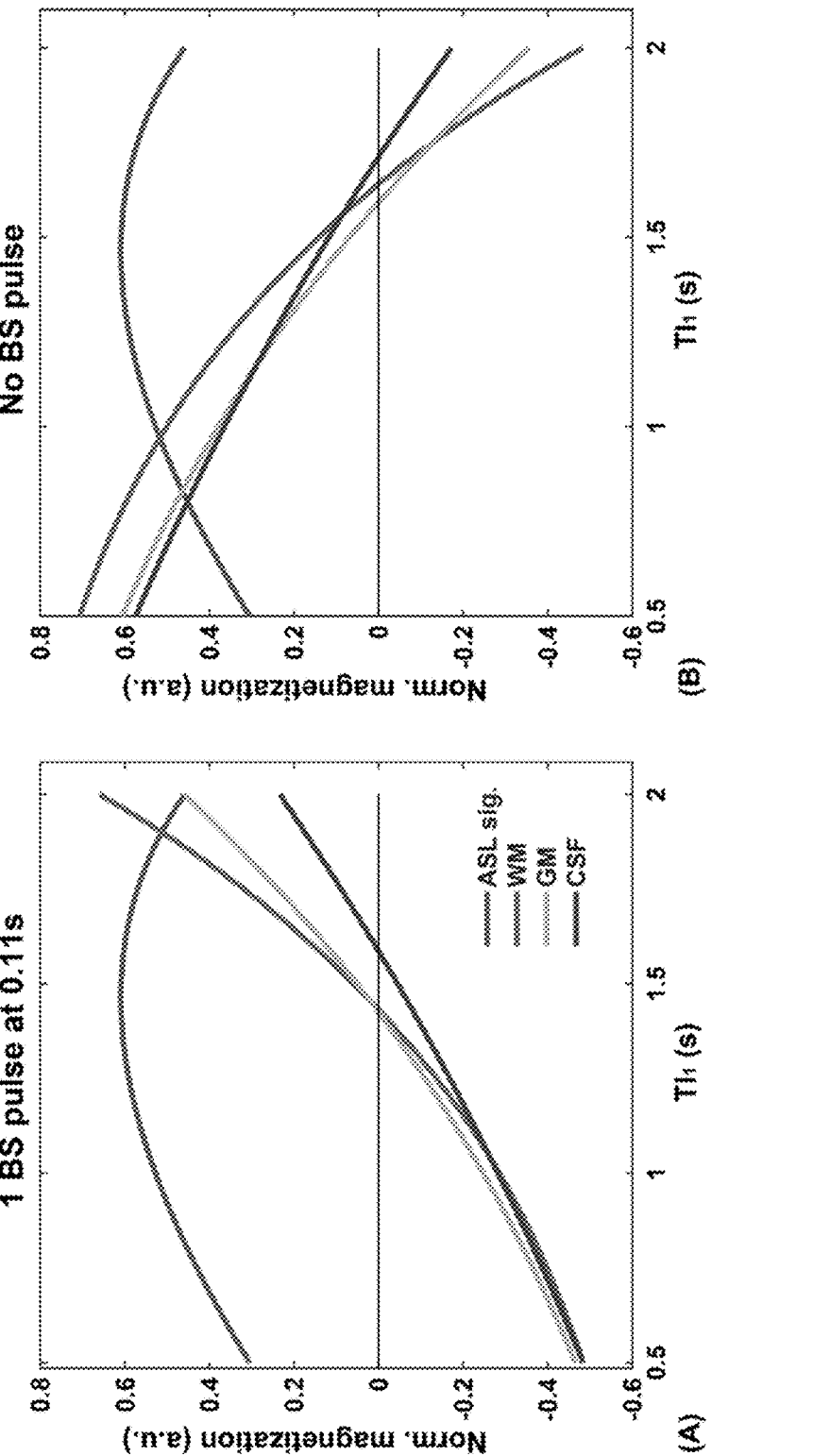
FIG. 8 shows an example of tissue magnetization and ASL signal at various inflow and inversion times.

FIG. 8 shows an example of tissue inversion and some consideration for determining best BS. It was found out by the inventor that the best was to perform background suppression is to not use BS pulses at all.

Figure 6:
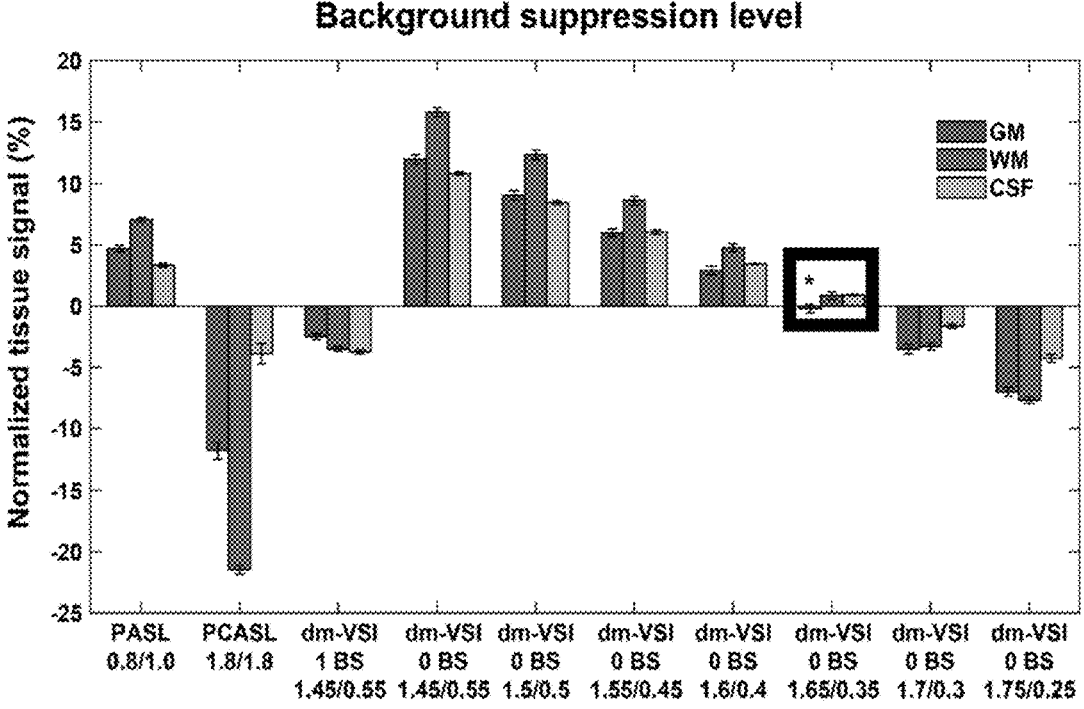
FIG. 6 shows example results obtained by various ASL methods and BS schemes.
Figure 9:
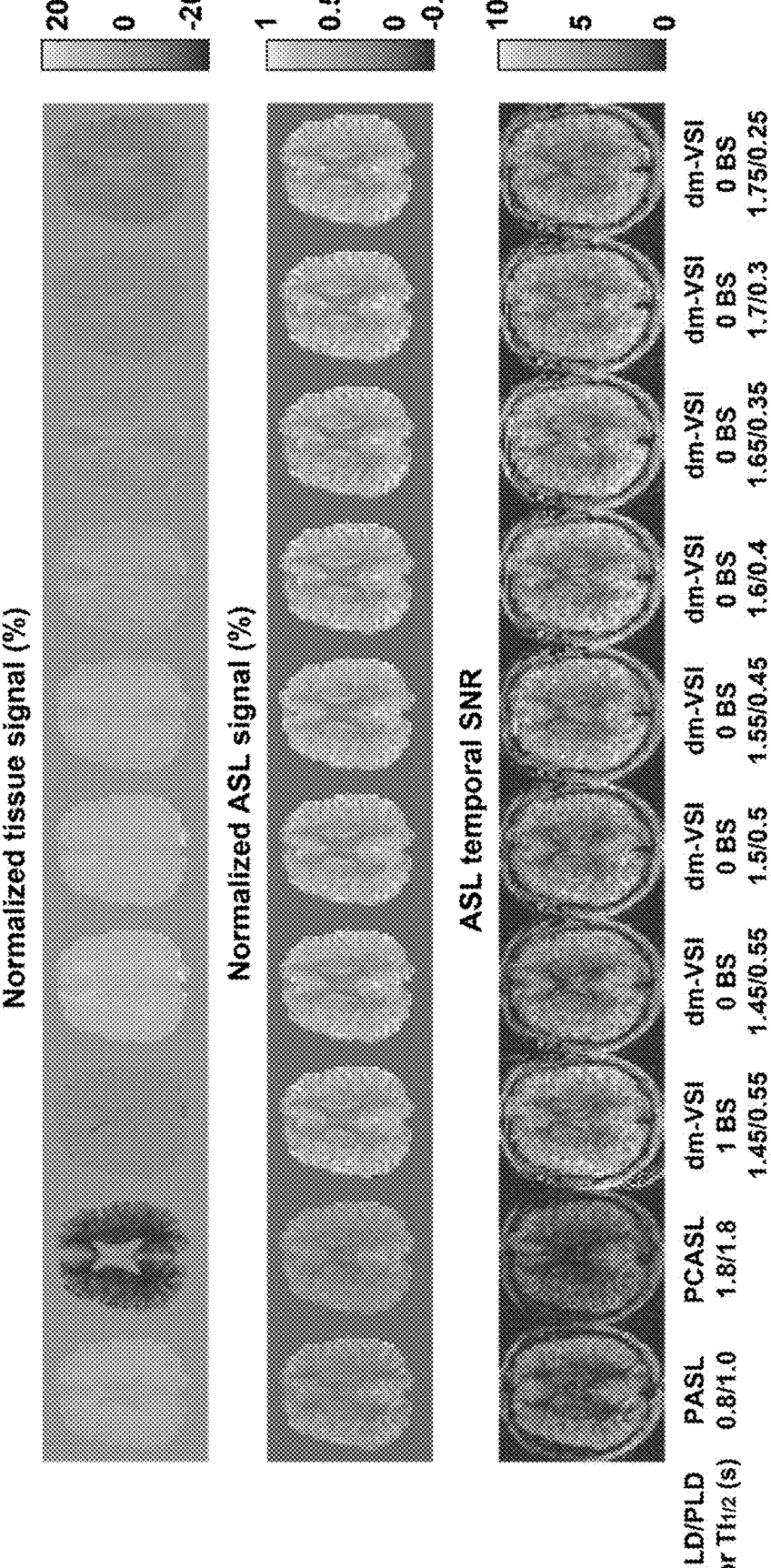
FIG. 9 shows MRI images obtained in a BS without a BS pulse.

FIG. 9 shows MRI images obtained in a BS without a BS pulse. For this experiment, 4 healthy subjects in the 25-40 were used. The graphs show normalized tissue signal (top row), normalized ASL signal (middle row) and ASL tSNR (bottom row) for various MRI pulse schemes including:

PASL (TI$_1$/TI=0.8/1.8 s),
PCASL (LD/PLD=1.8/1.8 s),
Dm-VSASL (sinc-VSI) with 1 BS pulse (strong).
Dm-VSASL without BS pulse, TI$_1$=1450~1750 ms, step size=50 ms
FIG. 6 shows example results obtained by various ASL pulse schemes, compared with a scheme in which no BS pulse is applied (see rectangular highlight).

FIG. 10 are graphs showing example results obtained in various MRI schemes, including a scheme that does not use BS pulse. It may be seen that optimal BS in dual-module VSASL can be achieved without using BS pulses, which also results in improved SNR and tSNR performance.

5. FURTHER EMBODIMENT EXAMPLES

As disclosed herein, in dm-VSASL, two VS labeling modules are used to label arterial blood to generate perfusion-weighted signals. If both labeling modules can invert the magnetization of static tissues (with velocity=0), then they can serve as inversion pulses for BS purposes too. The VS labeling pulses that can invert static tissues include: 1) VS inversion pulses, such as rect-VSI, sinc-VSI or other inversion-based VS pulses; 2) VS saturation pulses with a built-in inversion (VSS$_{inv}$), which can be implemented in several ways, such as adding a phase of $\pi$ to the last segment of the symmetric BIR-8 (sBIR8) pulse, or the last tip-up RF pulse in double-refocused hyperbolic secant (DRHS) pulse.

The timings of the two VS labeling modules can then be adjusted, according to the dm-VSASL signal model, to: 1) ensure that little to none ASL signal reduction will occur under such timings; 2) the background tissue signals are sufficiently suppressed. In this process, the relaxation effects (especially that from T2 relaxation) of the labeling modules on the tissues should be taken into account to predict the magnetization response based on the T1 and T2 relaxation time constants of the tissue. The levels of BS can be controlled by adjusting the timings of the two VS labeling pulses, according to the specific applications and the tissue relaxation time constants.

Compared to existing BS methods in VSASL, the new method (e.g., method 100) has the following advantages:

1) More VSASL signal is preserved. Since each additional BS pulse reduces the ASL signal by 5%, by eliminating the use of these pulses, the new BS method recovers such signal loss due to imperfect BS pulses. This results in higher ASL signal and improved SNR. Our preliminary results from a few subjects (n=4) showed that the ASL signal can be improved by up to 10.6% in GM and 17.2% in WM, and the temporal SNR by 2.9% in GM and 11.7% in WM, compared to the best existing BS method in dm-VSASL which used 1 additional BS pulse.

2) Since no additional RF pulses are used, less RF energy will be needed in VSASL scans, and less heating from RF pulses is expected. It can improve both the safety and the comfort of the subject/patient. This is particularly important when implemented at ultra-high field strengths, such as 7.4 T and 11.7 T, as the BS pulses are typically high-energy adiabatic inversion pulses.

In some applications it may be worth trading some ASL signal for a better suppression of background tissue signals, as the reduction in the tissue signals and their noise may overweight the slight reduction of the ASL signal, and still result in improved SNR performance.

6. EXAMPLE TECHNICAL SOLUTIONS

1. A method of operating a magnetic resonance imaging (MRI) system (e.g., method 100 depicted in FIG. 11), comprising: configuring (102) the MRI system to receive, by a machine interface, an input indicative of time intervals to be used for imaging a target object; controlling (104) the one or more RF coils to apply a first order of modules including at least a first control module at a first time point and a first labeling module at a second time point to a target object, wherein both the first and the second modules invert a magnetization of the target object; controlling (106) the one or more RF coils to operate a second order of modules including at least a second labeling module at a third time point and a second control module at a fourth time point to the target object, wherein both the third and the fourth modules invert the magnetization of the target object, wherein the time intervals correspond to time differences between the first time point and the second time point, between the third and the fourth time point, between the second time point and an image acquisition time, and between the fourth time point and the image acquisition.

An example of this method is depicted in FIG. 12. The top graph shows a timeline of application of control modules, separated by a time TI1 from labeling module(s), separated from a vascular crushing module (VCM) after which an image of the target is obtained. The bottom graph shows a timeline of application of labeling module(s) separated by time TI1 from control module(s) that are separated from VCM, after which imaging is obtained.

In some embodiments, the machine interface may be a touchscreen panel (e.g., a liquid crystal display or a light emitting diode display) that may be coupled to the processor that displays a menu that can be selected by a human operator using conventional human machine interaction techniques. For example, the target object may be known to the human operator and may be selectable through a menu scrolling. Once the target object is identified, the MRI system may be able to identify time interval values that may be pre-stored in its memory. In some embodiments, a database is provided in the MRI system to include time differences and or the time points that are determined to be the best selection when obtaining MRI images. An operator of the MRI system may make a selection from the machine interface based on actual time values, or based on a description of the target subject (e.g., a specific body part or a specific MRI code assigned to the procedure), which is then used to look up the time instances or the time interval at which the labeling modules and/or the crushing modules are applied to the target subject. As disclosed herein, notably, the MRI system refrains from applying any suppression pulses to the target object.

2. The method of solution 1, wherein the time intervals are based on magnetic resonance properties of the target object.

3. The method of solution 2, wherein the magnetic resonance properties include T1 and/or T2 time constants, and/or parameters of the modules for suppressing the magnetization of the target object.

4. The method of any of solutions 1-3, wherein the time interval between the first time point and the second time point equals that between the third and the fourth time point.

5. The method of any of solutions 1-4, wherein the time interval between the second time point and the image acquisition equals that between the fourth time point and the image acquisition.

6. A magnetic resonance imaging (MRI) system (e. g., system 200 depicted in FIG. 13), comprising: a magnet (202); one or more radio frequency (RF) coils (204); one or more processors (208); and a machine interface (206); wherein the one or more processors are configured to generate an MRI image by: receiving, on the machine interface, an input indicative of time intervals to be used for imaging a target object; controlling the one or more RF coils to apply a first order of modules including at least a first control module at a first time point and a first labeling module at a second time point to a target object, wherein both the first and the second modules invert a magnetization of the target object; controlling the one or more RF coils to operate a second order of modules including at least a second labeling module at a third time point and a second control module at a fourth time point to the target object, wherein both the third and the fourth modules invert the magnetization of the target object, wherein the time intervals correspond to time differences between the first time point and the second time point, between the third and the fourth time point, between the second time point and an image acquisition, and between the fourth time point and the image acquisition.

7. The MRI system of solution 6, wherein the time intervals are based on magnetic resonance properties of the target object.

8. The MRI system of solution 7, wherein the magnetic resonance properties include T1 and/or T2 time constants, and/or parameters of the modules for suppressing the magnetization of the target object.

9. The MRI system of any of solutions 6-8, wherein the time interval between the first time point and the second time point equals that between the third and the fourth time point.

10. The MRI system of any of solutions 6-9, wherein the time interval between the second time point and the image acquisition equals that between the fourth time point and the image acquisition.

11. A computer readable medium having processor-executable code for implementing a method of obtaining a magnetic resonance imaging (MRI) image of a target using an MRI system, the code, upon execution by a processor, causing the processor to receive, from a machine interface, an input indicative of time intervals to be used for imaging a target object; control one or more RF coils to apply a first order of modules including at least a first control module at a first time point and a first labeling module at a second time point to a target object, wherein both the first and the second modules invert a magnetization of the target object; control the one or more RF coils to operate a second order of modules including at least a second labeling module at a third time point and a second control module at a fourth time point to the target object, wherein both the third and the fourth modules invert the magnetization of the target object, wherein the time intervals correspond to time differences between the first time point and the second time point, between the third and the fourth time point, between the second time point and an image acquisition, and between the fourth time point and the image acquisition.

12. The computer readable medium of solution 11, wherein the time intervals are based on magnetic resonance properties of the target object.

13. The computer readable medium of solution 12, wherein the magnetic resonance properties include T1 and/or T2 time constants, and/or parameters of the modules for suppressing the magnetization of the target object.

14. The computer readable medium of any of solutions 11-13, wherein the time interval between the first time point and the second time point equals that between the third and the fourth time point.

15. The computer readable medium of any of solutions 11-14, wherein the time interval between the second time point and the image acquisition equals that between the fourth time point and the image acquisition.

Figure 13:
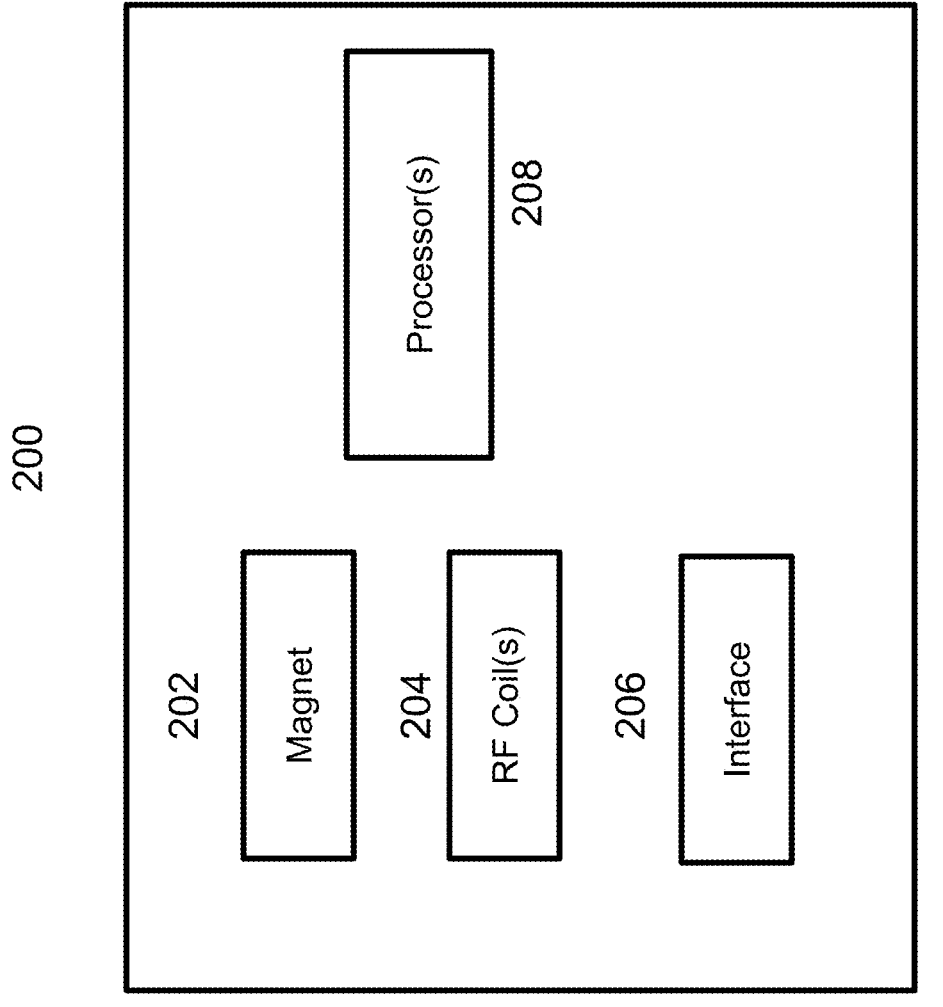
FIG. 13 is a block diagram of an example MRI system.

FIG. 13 is a block diagram of an example of an MRI system 200. The system includes a scanner (210) comprising one or more magnets (202), one or more gradient coils (204) and a radio frequency (RF) system (206). One or more processors 208 may control operation of the MRI system 200. In some embodiments, the one or more processors 208 may be in communication with a user interface from which the MRI system 200 may receive operator input(s) regarding operational parameters, e.g., time interval value selection, as disclosed herein.

7. CONCLUSION

While this specification contains many specifics, these should not be construed as limitations on the scope of an invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or a variation of a subcombination.

The described systems, apparatus and techniques can be implemented in electronic circuitry, computer hardware, firmware, software, or in combinations of them, such as the structural means disclosed in this specification and structural equivalents thereof. This can include at least one computer-readable storage medium embodying a program operable to cause one or more data processing apparatus (e.g., a signal processing device including a programmable processor) to perform operations described. Thus, program implementations can be realized from a disclosed method, system, or apparatus, and apparatus implementations can be realized from a disclosed system, computer-readable medium, or method. Similarly, method implementations can be realized from a disclosed system, computer-readable medium, or apparatus, and system implementations can be realized from a disclosed method, computer-readable medium, or apparatus.

Only a few implementations are disclosed. However, variations and enhancements of the disclosed implementations and other implementations can be made based on what is described and illustrated in this specification.

The invention claimed is:

1. A method of operating a magnetic resonance imaging (MRI) system for arterial spin labeling (ASL), comprising:

configuring the MRI system to receive, by a machine interface, an input indicative of time intervals to be used for imaging a target object, wherein the time intervals are pre-stored in a memory based on properties of the target object;

controlling one or more RF coils to apply a first order of modules under a control condition including at least a first control module at a first time point and a first labeling module at a second time point to the target object, wherein both the first and the second modules invert a magnetization of the target object;

controlling the one or more RF coils to operate a second order of modules under a labeling condition including at least a second labeling module at a third time point and a second control module at a fourth time point to the target object, wherein both the third and the fourth modules invert the magnetization of the target object, wherein the time intervals correspond to time differences between the first time point and the second time point, between the third and the fourth time point, between the second time point and an image acquisition time, and between the fourth time point and the image acquisition.

2. The method of claim 1, wherein the time intervals are based on magnetic resonance properties of the target object.

3. The method of claim 2, wherein the magnetic resonance properties include T1 and/or T2 time constants, and/or parameters of the modules for suppressing the magnetization of the target object.

4. The method of claim 1, wherein the time interval between the first time point and the second time point equals that between the third and the fourth time point.

5. The method of claim 1, wherein the time interval between the second time point and the image acquisition equals that between the fourth time point and the image acquisition.

6. The method of claim 1, wherein the machine interface is a touchscreen panel configured to display a menu for selecting the time intervals.

7. The method of claim 6, wherein the menu comprises time values or a description of the target object.

8. A magnetic resonance imaging (MRI) system for arterial spin labeling (ASL), comprising:
    a magnet;
    one or more radio frequency (RF) coils;
    one or more processors; and
    a machine interface;
    wherein the one or more processors are configured to generate an MRI image by:
    receiving, on the machine interface, an input indicative of time intervals to be used for imaging a target object;
        wherein the time intervals are pre-stored in a memory based on properties of the target object;
    controlling the one or more RF coils to apply a first order of modules under a control condition including at least a first control module at a first time point and a first labeling module at a second time point to the target object, wherein both the first and the second modules invert a magnetization of the target object;
    controlling the one or more RF coils to operate a second order of modules under a labeling condition including at least a second labeling module at a third time point and a second control module at a fourth time point to the target object, wherein both the third and the fourth modules invert the magnetization of the target object, wherein the time intervals correspond to time differences between the first time point and the second time point, between the third and the fourth time point, between the second time point and an image acquisition, and between the fourth time point and the image acquisition.

9. The MRI system of claim 8, wherein the time intervals are based on magnetic resonance properties of the target object.

10. The MRI system of claim 9, wherein the magnetic resonance properties include T1 and/or T2 time constants, and/or parameters of the modules for suppressing the magnetization of the target object.

11. The MRI system of claim 8, wherein the time interval between the first time point and the second time point equals that between the third and the fourth time point.

12. The MRI system of claim 8, wherein the time interval between the second time point and the image acquisition equals that between the fourth time point and the image acquisition.

13. The MRI system of claim 8, wherein the machine interface is a touchscreen panel configured to display a menu for selecting the time intervals based on the target object.

14. The MRI system of claim 13, wherein machine interface is configured such that the target object is selectable on the menu by scrolling.

15. A non-transitory computer readable medium having processor-executable code for implementing a method of obtaining a magnetic resonance imaging (MRI) image of a target object using an MRI system for arterial spin labeling (ASL), the code, upon execution by a processor, causing the processor to:
    receiving, from a machine interface, an input indicative of time intervals to be used for imaging the target object;
        wherein the time intervals are pre-stored in a memory based on properties of the target object;
    controlling one or more RF coils to apply a first order of modules under a control condition including at least a first control module at a first time point and a first labeling module at a second time point to the target object, wherein both the first and the second modules invert a magnetization of the target object;
    controlling the one or more RF coils to operate a second order of modules under a labeling condition including at least a second labeling module at a third time point and a second control module at a fourth time point to the target object, wherein both the third and the fourth modules invert the magnetization of the target object, wherein the time intervals correspond to time differences between the first time point and the second time point, between the third and the fourth time point, between the second time point and an image acquisition, and between the fourth time point and the image acquisition.

16. The computer readable medium of claim 15, wherein the time intervals are based on magnetic resonance properties of the target object.

17. The computer readable medium of claim 16, wherein the magnetic resonance properties include T1 and/or T2 time constants, and/or parameters of the modules for suppressing the magnetization of the target object.

18. The computer readable medium of claim 15, wherein the time interval between the first time point and the second time point equals that between the third and the fourth time point.

19. The computer readable medium of claim 15, wherein the time interval between the second time point and the image acquisition equals that between the fourth time point and the image acquisition.

20. The computer readable medium of claim 15, wherein the machine interface is a touchscreen panel configured to display a menu for selecting the time intervals based on the target object.

* * * * *